(12) United States Patent
Hellberg

(10) Patent No.: US 9,853,604 B2
(45) Date of Patent: Dec. 26, 2017

(54) AMPLIFIER CIRCUIT AND METHOD

(71) Applicant: TELEFONAKTIEBOLAGET L M ERICSSON (PUBL), Stockholm (SE)

(72) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/900,726

(22) PCT Filed: Jun. 28, 2013

(86) PCT No.: PCT/EP2013/063732
§ 371 (c)(1),
(2) Date: Dec. 22, 2015

(87) PCT Pub. No.: WO2014/206502
PCT Pub. Date: Dec. 31, 2014

(65) Prior Publication Data
US 2016/0149541 A1 May 26, 2016

(51) Int. Cl.
*H03F 3/68* (2006.01)
*H03F 1/02* (2006.01)
(Continued)

(52) U.S. Cl.
CPC .............. *H03F 1/0288* (2013.01); *H01P 5/12* (2013.01); *H03F 1/0294* (2013.01); *H03F 3/19* (2013.01);
(Continued)

(58) Field of Classification Search
CPC . H03F 1/07; H03F 1/0288; H03F 3/68; H03F 1/3252; H03F 1/06; H03F 3/24; H03F 3/60
(Continued)

(56) References Cited

U.S. PATENT DOCUMENTS 5,025,225 A 6/1991 Tajima et al.
6,472,934 B1 10/2002 Pehlke
(Continued)

FOREIGN PATENT DOCUMENTS

EP 2403135 A1 1/2012
EP 2568598 A1 3/2013
EP 2608400 A1 6/2013

OTHER PUBLICATIONS

Doherty, "A new high efficiency power amplifier for modulated waves," Proceedings of the Institute of Radio Engineers, vol. 24, No. 9, Sep. 1936, pp. 1163-1182.
(Continued)

*Primary Examiner* — Steven J Mottola
*Assistant Examiner* — Hafizur Rahman

(57) ABSTRACT

An amplifier arrangement comprises N amplifier stages, wherein N is an integer equal or greater than four. The amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines. An amplifier of the Nth stage is coupled to the output node, and remaining amplifiers between the first and Nth stages coupled to successive junctions in the cascade of quarter wavelength transmission lines. The amplifier arrangement is further configured such that the amplifier of the Nth stage is coupled to the output node via a connecting quarter wavelength transmission line, and whereby each of the remaining amplifiers of the N−2 stages closest to the output node is coupled by a respective connecting quarter wavelength transmission line to a respective junction of the cascade of quarter wavelength transmission lines.

17 Claims, 43 Drawing Sheets

(51) Int. Cl.
  *H03F 3/195*  (2006.01)
  *H03F 3/24*  (2006.01)
  *H03F 3/60*  (2006.01)
  *H01P 5/12*  (2006.01)
  *H03F 3/19*  (2006.01)
  *H03F 3/21*  (2006.01)

(52) U.S. Cl.
  CPC ............. *H03F 3/195* (2013.01); *H03F 3/211* (2013.01); *H03F 3/245* (2013.01); *H03F 3/602* (2013.01); *H03F 2200/451* (2013.01); *H03F 2203/21106* (2013.01)

(58) Field of Classification Search
  USPC ......... 330/10, 84, 86, 124 R, 126, 129, 130, 330/207 D, 251, 295; 332/103, 145; 333/117, 122, 124, 204, 205, 219, 248; 379/338, 443; 455/127.1, 143
  See application file for complete search history.

(56) References Cited

U.S. PATENT DOCUMENTS

| | | |
|---|---|---|
| 8,022,760 B2 | 9/2011 | Gajadharsing et al. |
| 8,653,889 B1* | 2/2014 | Acimovic ............. H03F 1/0288 330/124 R |
| 2006/0145757 A1* | 7/2006 | Kim ...................... H03F 1/0288 330/124 R |
| 2013/0181773 A1* | 7/2013 | Liu .......................... H03F 3/68 330/124 R |
| 2014/0320214 A1* | 10/2014 | Liu ...................... H03F 1/0288 330/295 |

OTHER PUBLICATIONS

Raab, "Efficiency of Doherty RF Power Amplifier Systems," IEEE Transactions on Broadcasting, vol. BC-33, No. 3, Sep. 1987, pp. 77-83.

* cited by examiner

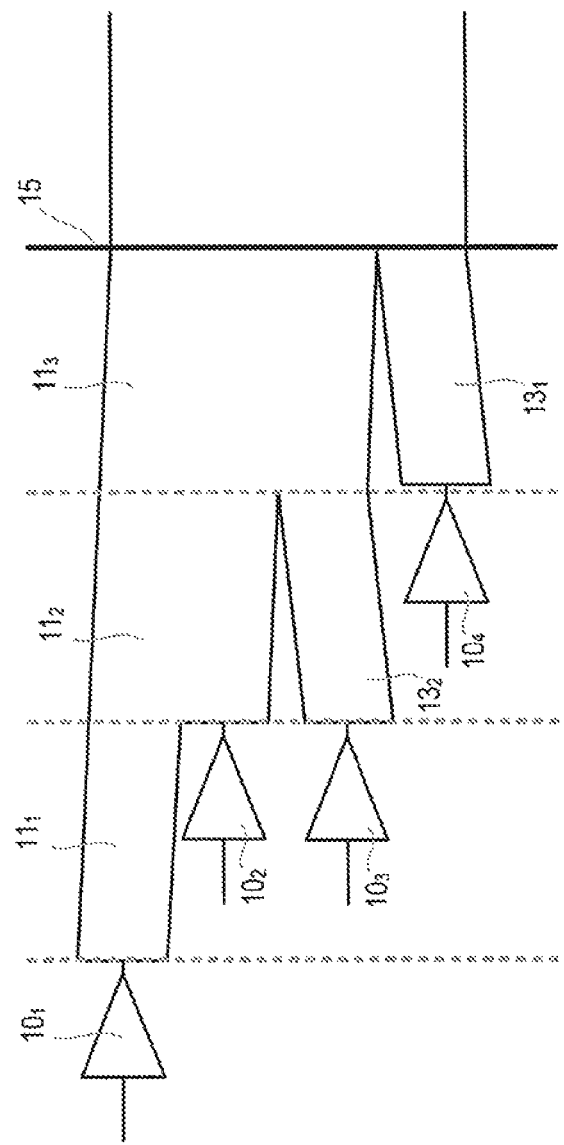

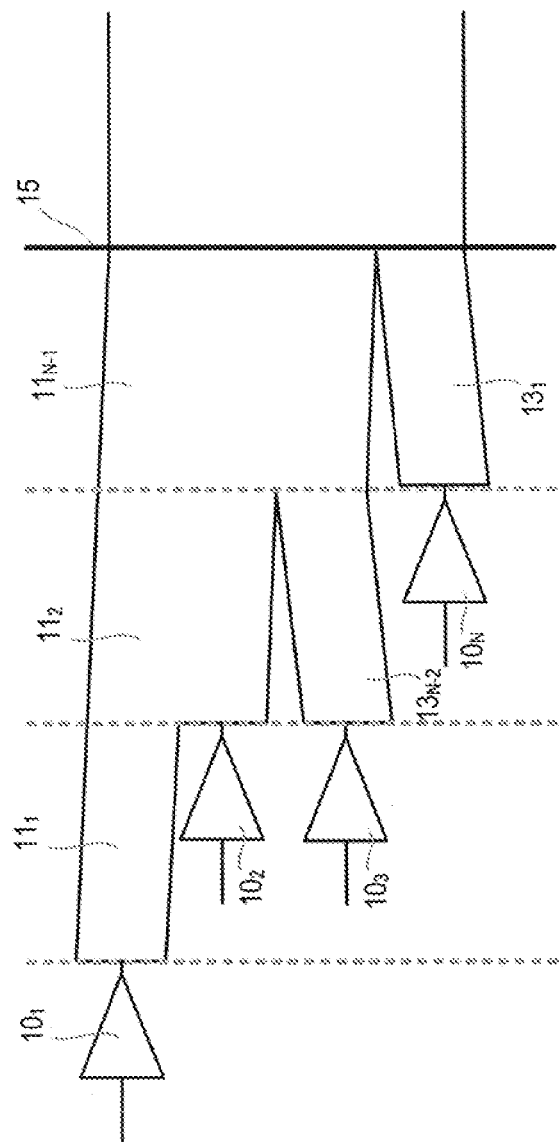

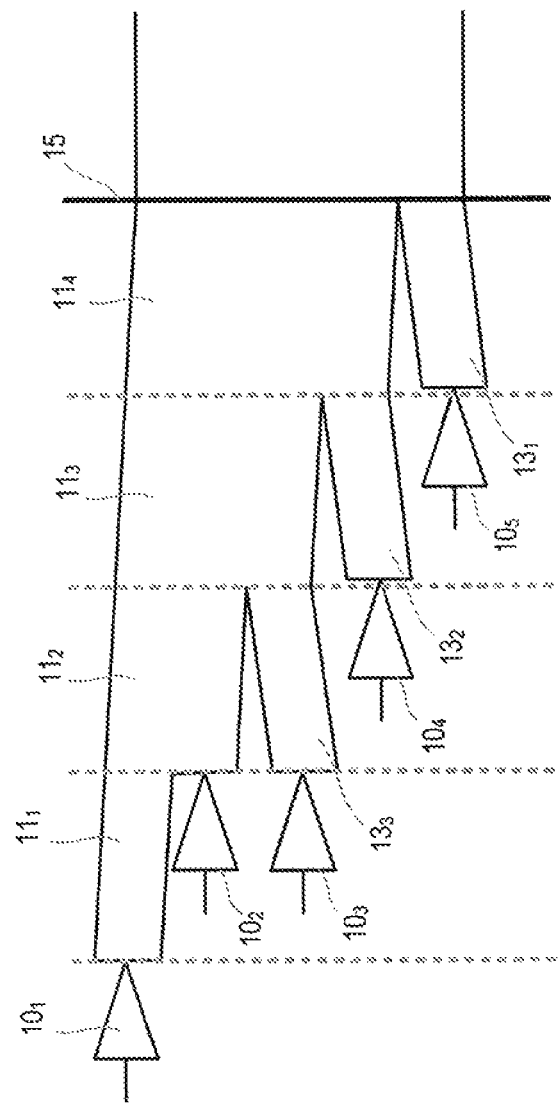

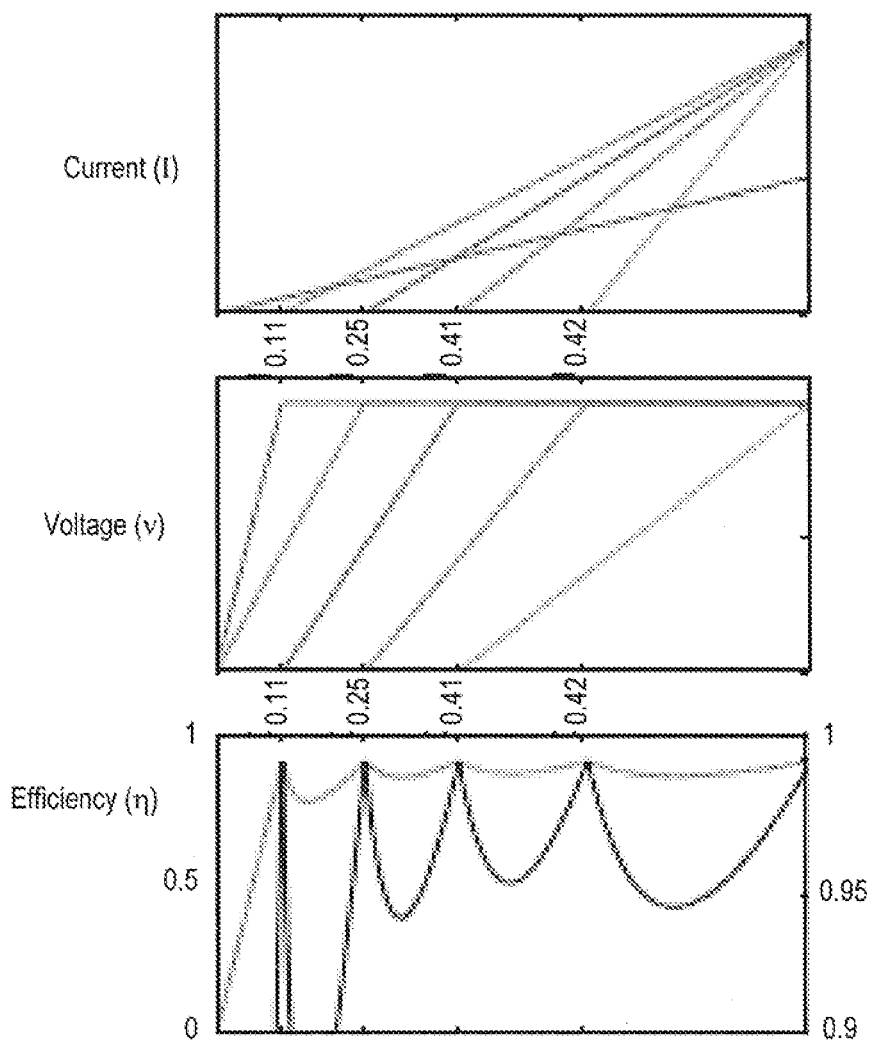

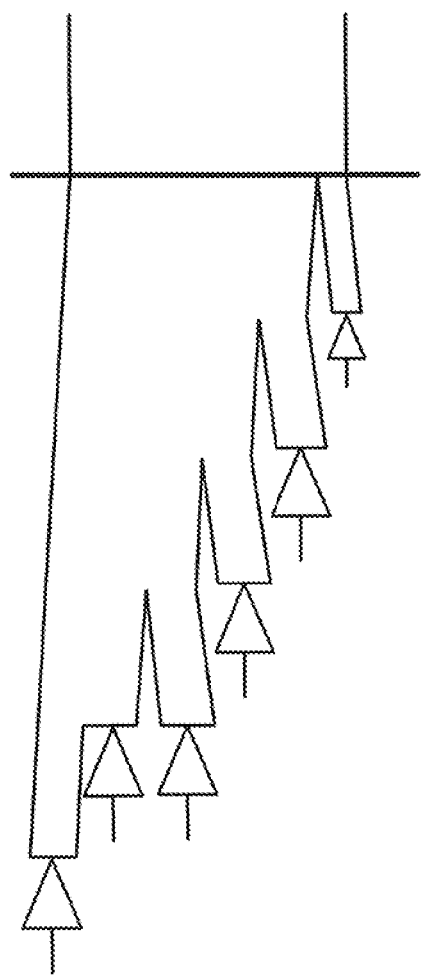

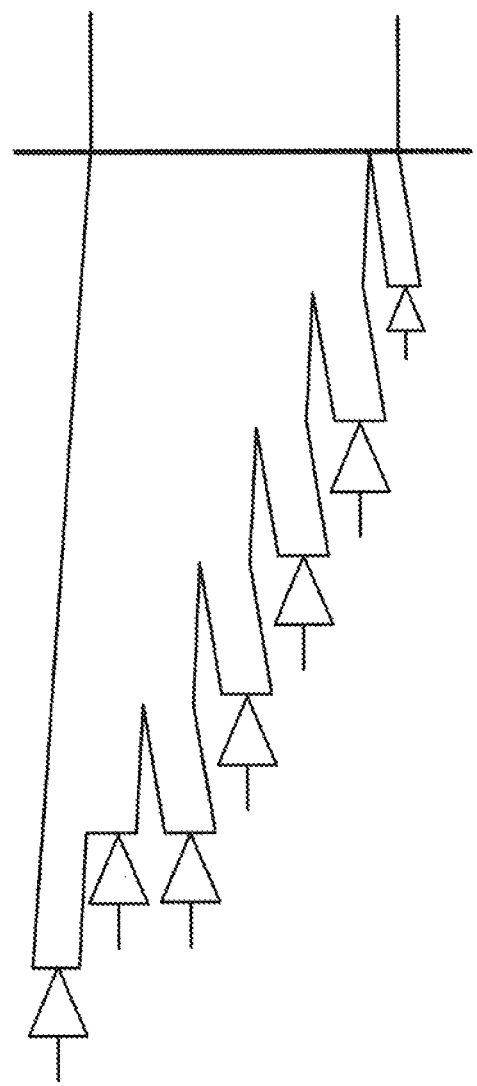

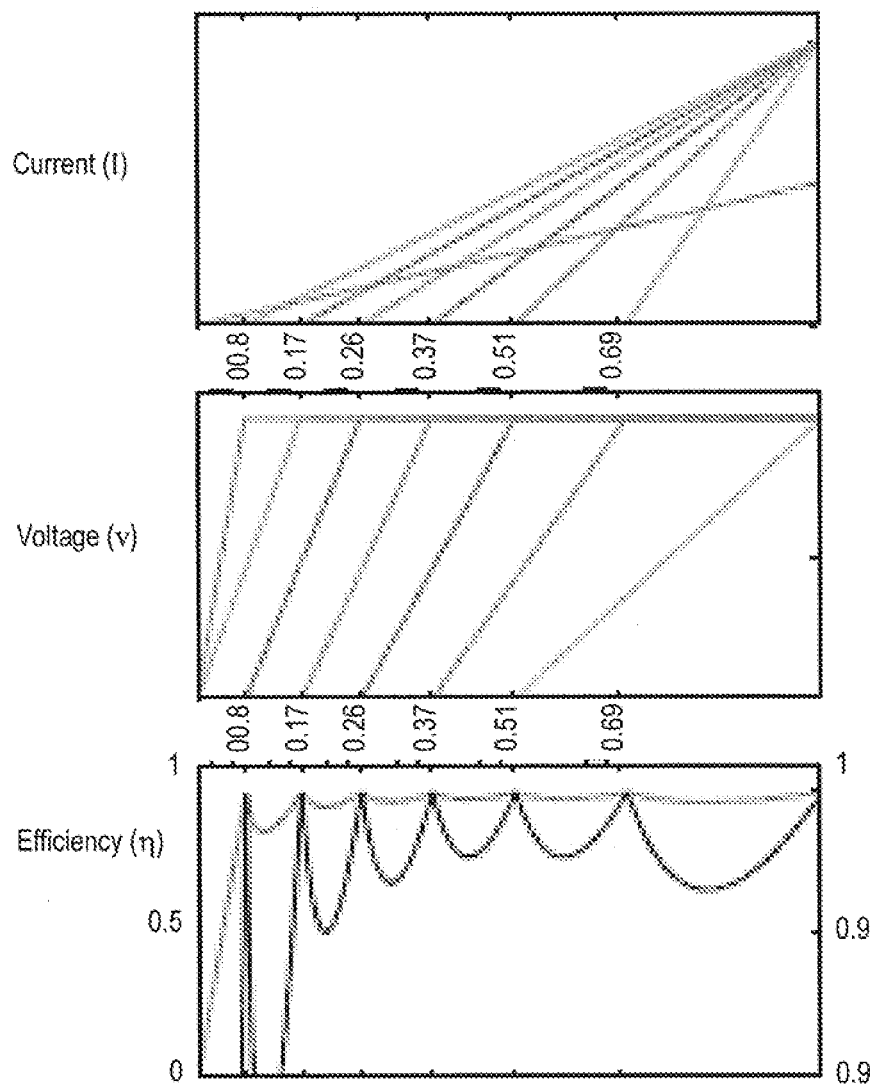

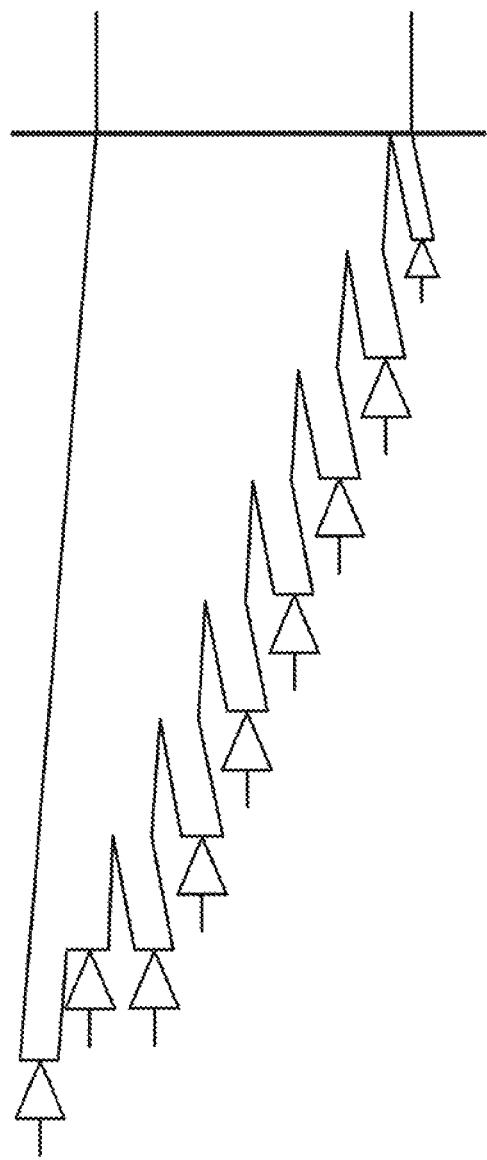

Current (I)

Voltage (v)

Efficiency

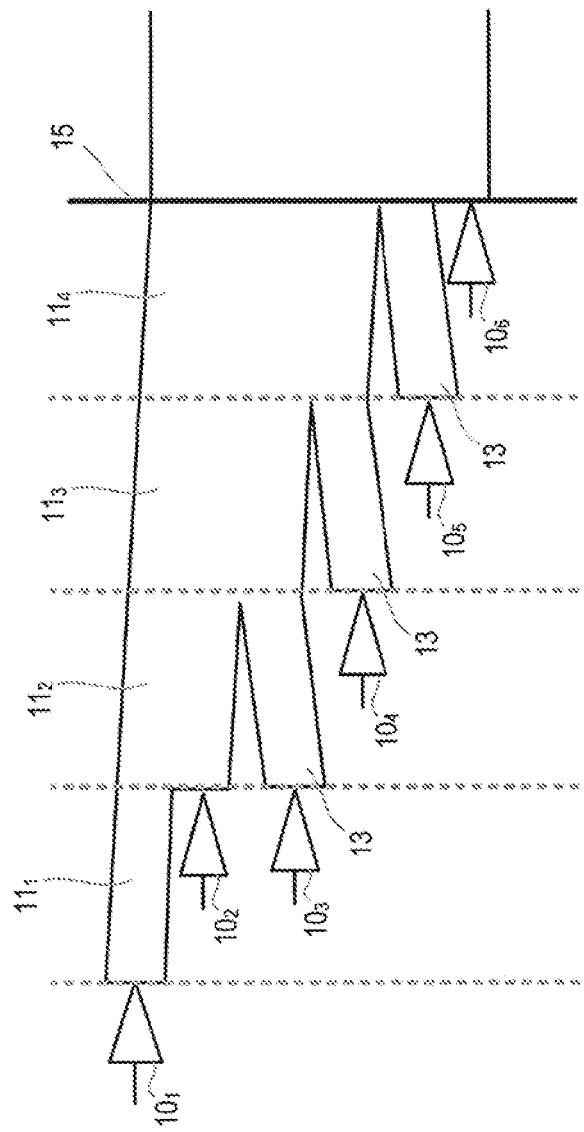

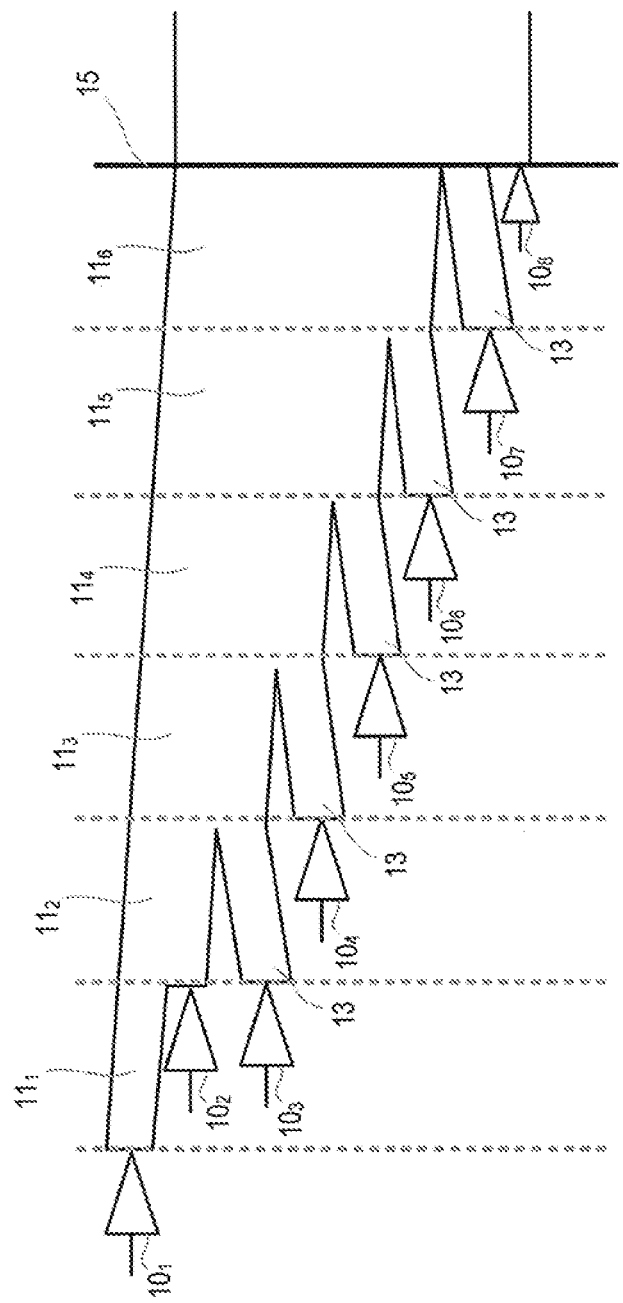

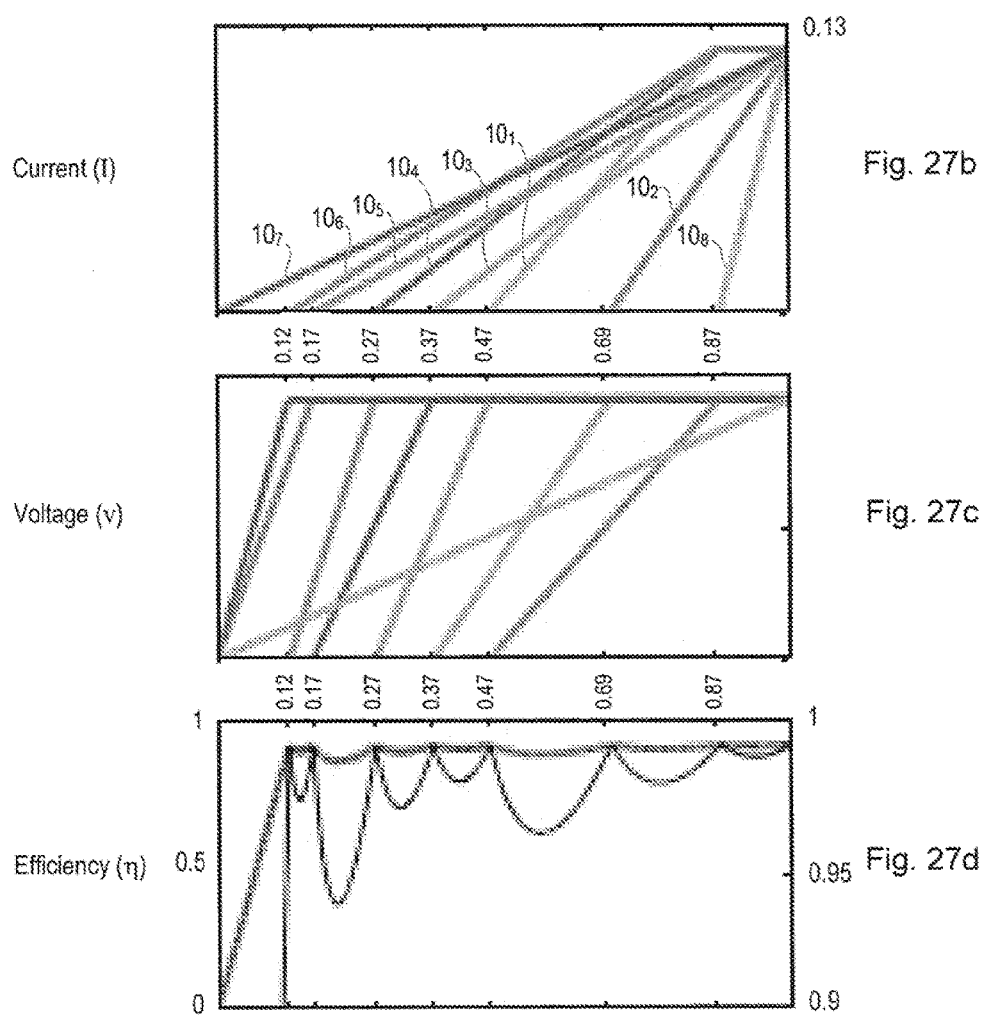

AMPLIFIER CIRCUIT AND METHOD

This application is a 371 of International Application No. PCT/EP2013/063732, filed Jun. 28, 2013, the disclosure of which is fully incorporated herein by reference.

TECHNICAL FIELD

The present invention relates generally to an amplifier circuit and method, and more particularly to an amplifier circuit and method which provides improved efficiency, for example an amplifier circuit comprising at least first and second amplifiers configured to operate in Chireix and Doherty modes of operation.

BACKGROUND

Power amplifiers are often used to amplify wideband signals or signal combinations with high peak to average power ratio, PAR. The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

It is known to have power amplifiers configured to operate in a Doherty mode or a Chireix mode of operation, based on multiple transistors with passive output network interaction and combination. Such power amplifiers are much more efficient than conventional amplifiers for amplitude-modulated signals that have a high peak-to-average ratio (PAR), since they have a much lower average sum of output currents from the amplifier transistors. It will be appreciated that such a reduced average output current leads to high average efficiency. This high average efficiency is because the DC currents drawn by the transistors are largely proportional to the RF current magnitudes. An example of a Doherty amplifier is described in "A new high efficiency power amplifier for modulated waves,", W. H. Doherty, Proc. IRE, vol. 24, no. 9, pp. 1163-1182, September 1936.

Reduced RF output currents are obtained by having high transimpedance from at least one transistor to the output, while having the possibility of in-phase combining all transistor outputs to obtain full output power. Higher transimpedance means higher voltage at the output for the same amount of current. This is achieved in the Doherty amplifier by having the main transistor ("carrier amplifier") displaced from the output node by a quarter wavelength transmission line of characteristic impedance Ropt. (A transistor's Ropt is the optimal load resistance for achieving maximum output power).

Since the load Rload has a lower value than Ropt (typically Rload=Ropt/2) this line acts as a quarterwave transformer. The transimpedance to the output from the main transistor is equal to the characteristic impedance of the quarterwave line (i.e. Ropt), instead of Rload as would be the case for one transistor coupled directly to the load. The self-impedance at the main transistor is increased quadratically to the characteristic impedance squared divided by Rload (aka "impedance inversion" of the load). If the peak transistor (also known as "auxiliary amplifier" or "peaking amplifier") has an Ropt that in parallel combination with the Ropt of the main transistor gives Rload, full combined output power will be possible by in-phase combining (i.e. adjusting the phase (time, electrical length) difference between the main and peak drive signals so the output waves from both are in phase at the output Rload).

The carrier amplifier output current is linear in amplitude, i.e. follows the desired output signal. The peaking amplifier output current is zero for low amplitudes, and rises (piecewise) linearly from the transition point. The transition point for a 2-stage Doherty designed for two equal size transistors is at half the maximum output amplitude. The shaping of the output RF current amplitude is in some cases done by biasing the gate low and increasing the RF drive voltage, known as class C operation. This shaping can also be done, wholly or partially, earlier in the processing chain, by analog or digital signal shaping circuits.

The first way to extend the Doherty amplifier to more stages (transistors, constituent amplifiers) was shown by F. H. Raab in a paper entitled "Efficiency of Doherty RF Power Amplifier Systems", IEEE Trans. Broadcasting, vol. BC-33, no. 3, pp. 77-83, September 1987. These amplifiers can be described as having a cascade of quarterwave transmission lines with successively lower characteristic impedance towards the output (load), where RF transistors are connected at the junctions between the transmission lines. The resulting amplifier makes it possible to have high efficiency in a wider range of back off.

U.S. Pat. No. 8,022,760 discloses an alternative arrangement for 3-transistor Doherty amplifiers, whose main benefit is better placement of the transition points (corresponding to high points in the efficiency vs. amplitude curve) for equal-sized transistors. Higher order versions of the 3-transistor Doherty amplifier in U.S. Pat. No. 8,022,760 consist of having a higher order quarterwave cascade multistage Doherty as a peaking amplifier. Only the ones with an odd total number, N, of transistors (5, 7, 9 etc. . . . ) work, i.e. those that have quarterwave cascades with an even number, N−1, of quarterwave lines.

EP2,403,135 discloses a four-transistor Doherty amplifier. This is basically the 3-stage amplifier of U.S. Pat. No. 8,022,760 with an added peaking amplifier at the output node and has largely the same advantages as U.S. Pat. No. 8,022,760 regarding transistor sizes. Higher order versions of EP2,403,135 consist of even numbers, N, of transistors, with both a directly connected and a quarterwave-connected transistor at the output node. The quarterwave cascade in the peaking amplifier branch will therefore have the total length, N−2, i.e. the same lengths as for the amplifiers in U.S. Pat. No. 8,022,760.

The multistage Doherty amplifiers by Raab generally have their transition points too high to give good average efficiency with high-PAR signals if the transistor stages are of equal size. FIGS. 1a, 1b and 1c show the curves for a 4-stage implementation, in which the lowest transition point is at 0.37 of full output. The amplifiers with higher numbers of stages generally have the same problem.

The amplitude-limited drive signals required for best operation can sometimes pose a problem of increased implementation complexity.

Referring to the curves of FIGS. 2a, 2b, and 2c, the 4-stage amplifier of EP2,403,135 has an advantage in that the lowest transition point with four equal size transistors is at 0.25 of full output amplitude (−12 dB). However, the distribution of transition points is not so good for high-PAR signals, since the higher transition points are at too high output amplitudes, as shown in FIGS. 3a to 3c. An amplitude-limited drive signal is also required for this amplifier.

For five and higher numbers of stages, implementations with equal size transistors of U.S. Pat. No. 8,022,760 and EP2,403,135 all suffer from too sparse transition points at low output amplitudes, as illustrated by FIGS. 3, 4 and 5.

In particular, FIGS. 3a to 3c relate to a 5-stage amplifier according to U.S. Pat. No. 8,022,760.

FIGS. 4a to 4c relate to a 6-stage amplifier according to EP2,403,135.

FIGS. 5a to 5c relate to a 7-stage amplifier according to U.S. Pat. No. 8,022,760.

Thus, each of the amplifier arrangements described in FIGS. 3, 4 and 5 have the disadvantage of requiring several (N−3) amplitude limited drive signals, and also have the disadvantage of having a poor distribution of transition points.

SUMMARY

It is an aim of the present invention to provide a method and apparatus which obviate or reduce at least one or more of the disadvantages mentioned above.

According to a first aspect of the present invention there is provided an amplifier arrangement comprising N amplifier stages, wherein N is an integer equal or greater than four. The amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines. An amplifier of the Nth stage is coupled to the output node, and remaining amplifiers between the first and Nth stages coupled to successive junctions in the cascade of quarter wavelength transmission lines. The amplifier arrangement is further configured such that the amplifier of the Nth stage is coupled to the output node via a connecting quarter wavelength transmission line, and each of the remaining amplifiers of the N−2 stages closest to the output node coupled by a respective connecting quarter wavelength transmission line to a respective junction of the cascade of quarter wavelength transmission lines.

An advantage of this arrangement is that it provides good efficiency for high PAR signals even with equal size transistors, due to a high density of transition points at low output amplitudes, as will be explained later in the application.

According to another aspect of the present invention there is provided a method of improving the efficiency of an amplifier arrangement comprising N amplifier stages, wherein N is an integer equal or greater than four; wherein the amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines, and wherein an amplifier of the Nth stage is coupled to the output node, and remaining amplifiers between the first and Nth stages coupled to successive junctions in the cascade of quarter wavelength transmission lines. The method comprises the steps of: coupling the amplifier of the Nth stage to the output node via a connecting quarter wavelength transmission line; and coupling each of the remaining amplifiers in the N−2 stages closest to the output node by a respective connecting quarter wavelength transmission line to a respective junction of the cascade of quarter wavelength transmission lines.

BRIEF DESCRIPTION OF THE DRAWINGS

For a better understanding of the present invention, and to show more clearly how it may be carried into effect, reference will now be made, by way of example only, to the following drawings in which:

FIG. 6a shows an amplifier arrangement according to an embodiment of the present invention;

FIG. 6b shows an amplifier arrangement according to an embodiment of the present invention;

FIG. 8a shows an amplifier arrangement according to an embodiment of the present invention;

FIGS. 8b to 8d show current, voltage and efficiency curves for the amplifier arrangement of FIG. 8a;

FIGS. 10b to 10d show current, voltage and efficiency curves for the amplifier arrangement of FIG. 10a;

FIGS. 16b to 16d show current, voltage and efficiency curves for the amplifier arrangement of FIG. 16a;

FIG. 17a shows an amplifier arrangement according to an embodiment of the present invention, with FIGS. 17b to 17d showing current, voltage and efficiency curves for the amplifier arrangement of FIG. 17a;

FIG. 18a shows an amplifier arrangement according to an embodiment of the present invention, with FIGS. 18b to 18d showing current, voltage and efficiency curves for the amplifier arrangement of FIG. 18a;

FIG. 19a shows an amplifier arrangement according to an embodiment of the present invention, with FIGS. 19b to 19d showing current, voltage and efficiency curves for the amplifier arrangement of FIG. 19a;

FIG. 20a shows an amplifier arrangement according to an embodiment of the present invention, with FIGS. 20b to 20d showing current, voltage and efficiency curves for the amplifier arrangement of FIG. 20a;

FIG. 21a shows an amplifier arrangement according to an embodiment of the present invention, with FIGS. 21b to 21d showing current, voltage and efficiency curves for the amplifier arrangement of FIG. 21a;

FIG. 22a shows an amplifier arrangement according to an embodiment of the present invention, with FIGS. 22b to 22d showing current, voltage and efficiency curves for the amplifier arrangement of FIG. 22a;

FIG. 23a shows an amplifier arrangement according to an embodiment of the present invention, with FIGS. 23b to 23d showing current, voltage and efficiency curves for the amplifier arrangement of FIG. 23a;

FIG. 24a shows an amplifier arrangement according to an embodiment of the present invention, with FIGS. 24b to 24d showing current, voltage and efficiency curves for the amplifier arrangement of FIG. 24a;

FIG. 26a shows an amplifier arrangement according to another aspect, with FIGS. 26b to 26d showing current, voltage and efficiency curves for the amplifier arrangement of FIG. 26a; and FIG. 27a shows an amplifier arrangement according to another aspect, with FIGS. 27b to 27d showing current, voltage and efficiency curves for the amplifier arrangement of FIG. 27a.

DETAILED DESCRIPTION

Figure 1A:
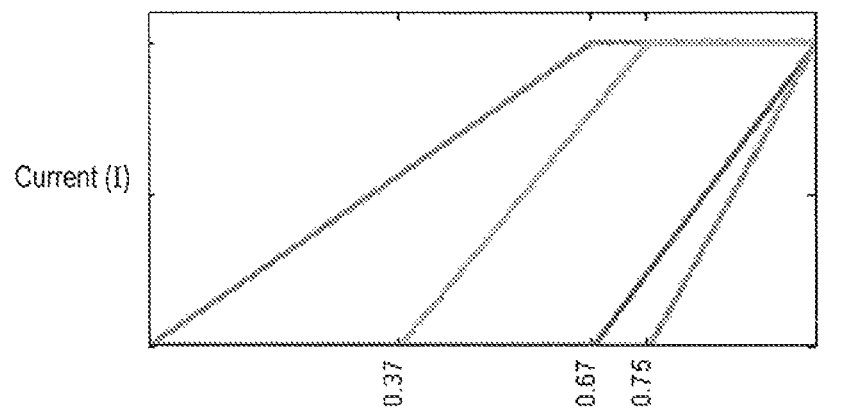
FIGS. 1a to 1c show current, voltage and efficiency curves for a known amplifier arrangement.
Figure 1B:
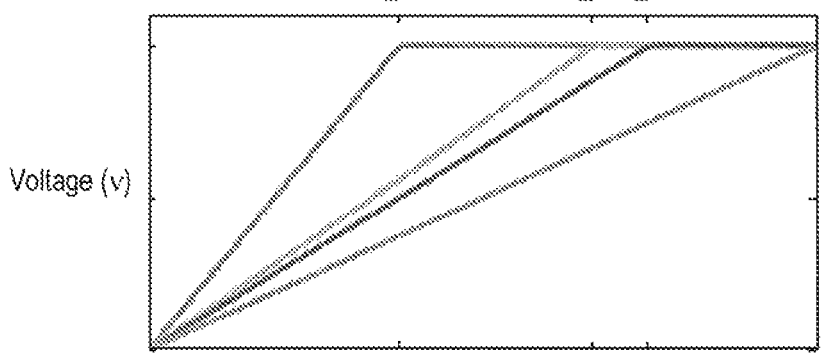
Figure 1C:
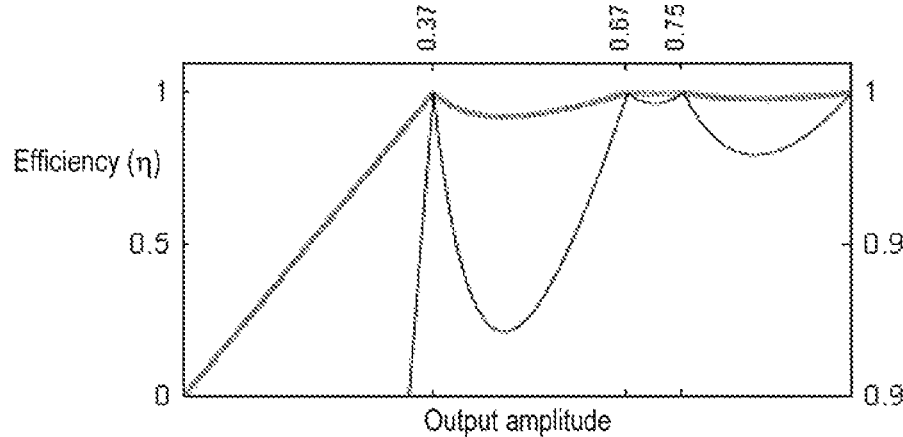
Figure 2A:
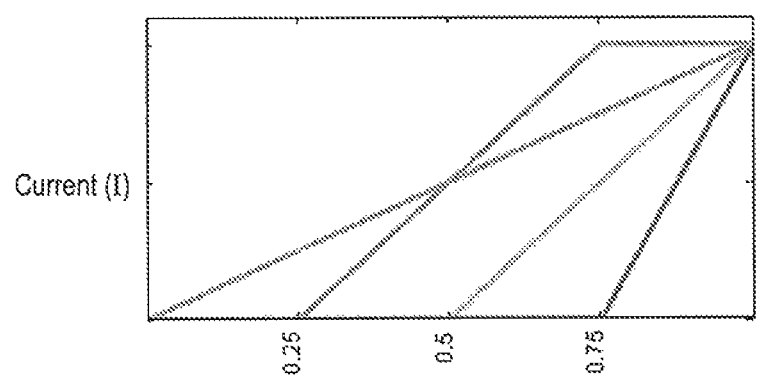
FIGS. 2a to 2c show current, voltage and efficiency curves for a known amplifier arrangement.
Figure 2B:
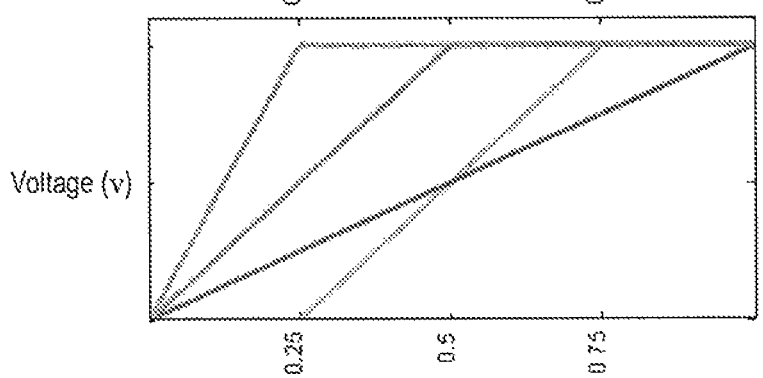
Figure 2C:
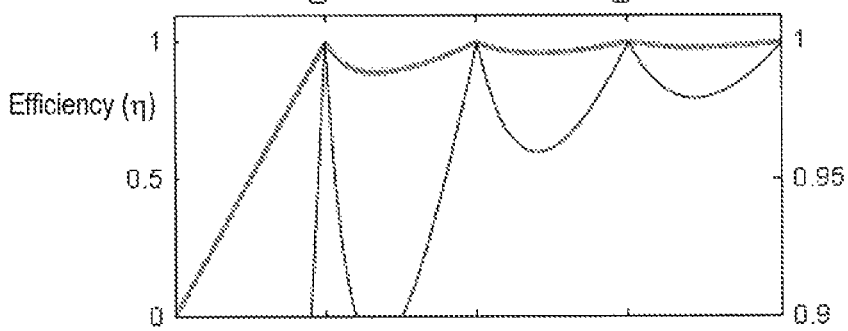
Figure 3A:
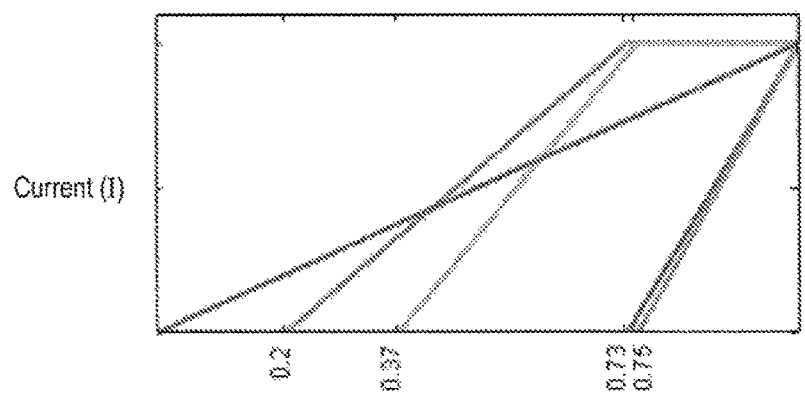
FIGS. 3a to 3c show current, voltage and efficiency curves for a known amplifier arrangement.
Figure 3B:
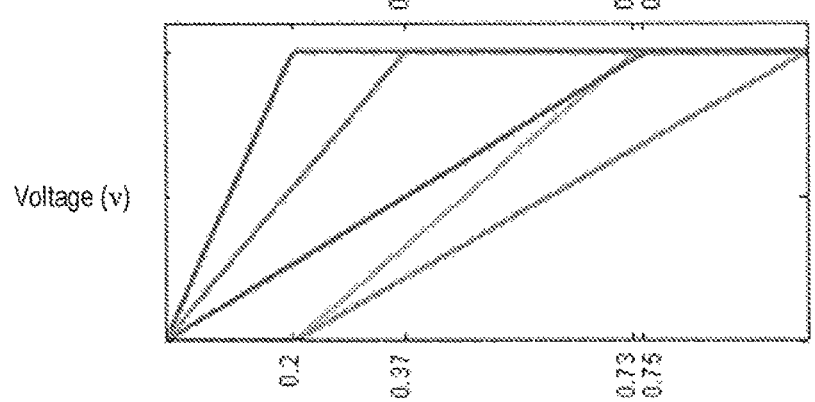
Figure 3C:
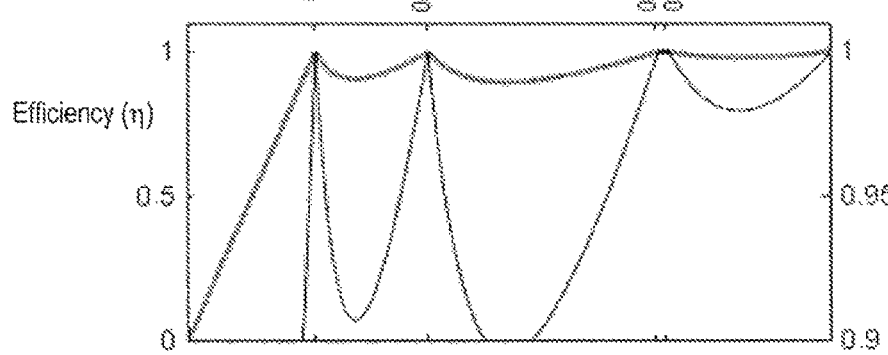
Figures 4A, 4B, 4C:
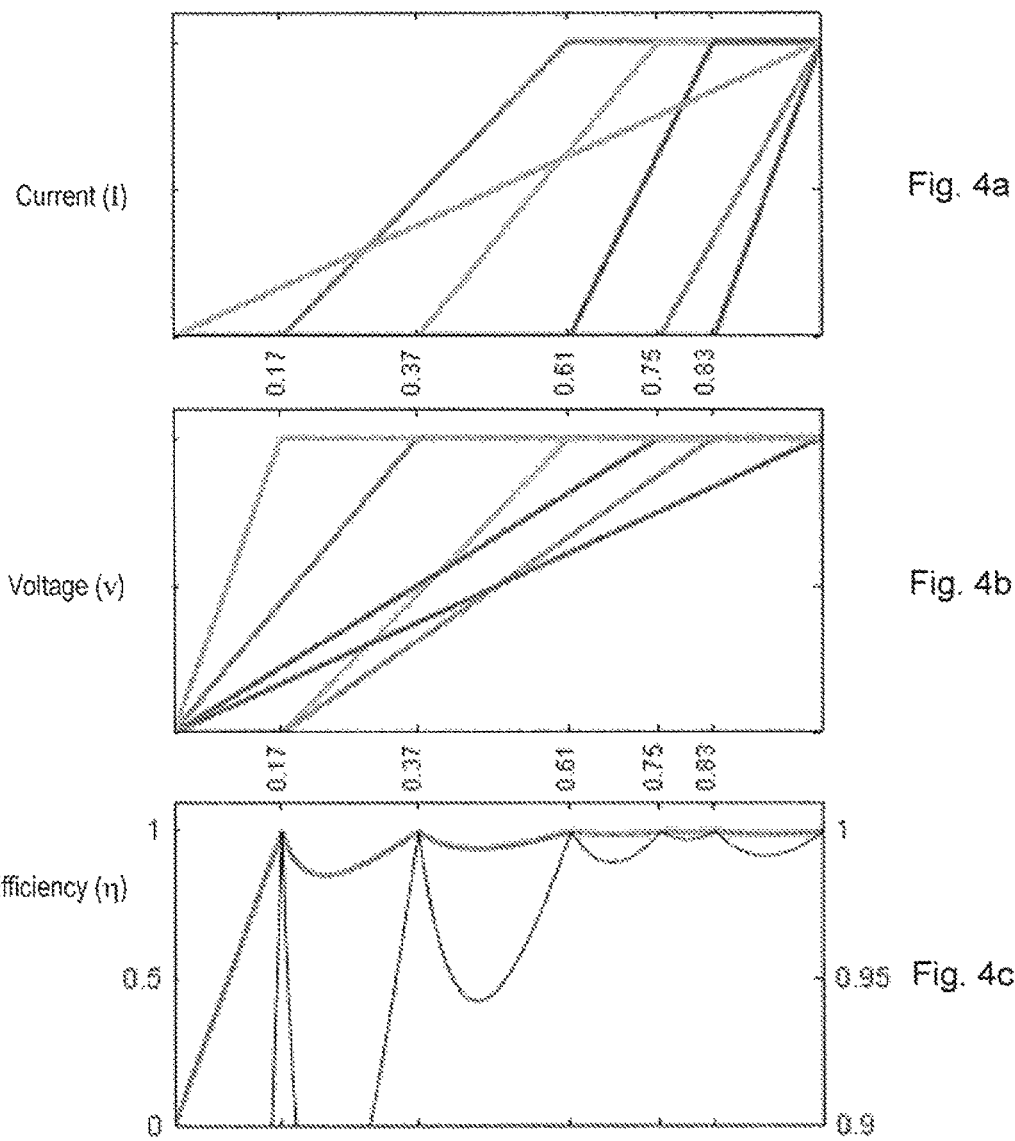
FIGS. 4a to 4c show current, voltage and efficiency curves for a known amplifier arrangement.
Figure 5A:
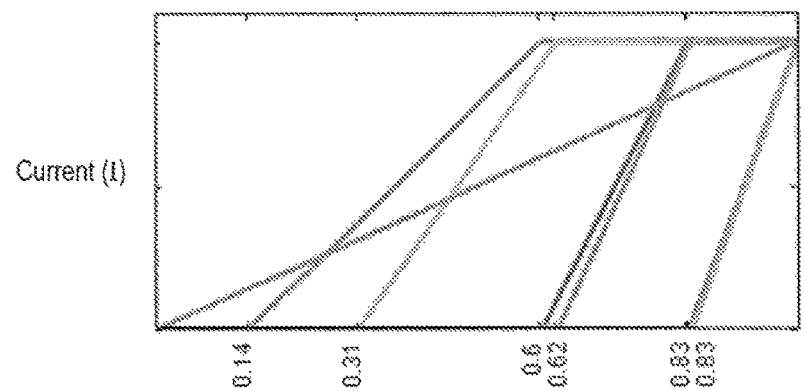
FIGS. 5a to 5c show current, voltage and efficiency curves for a known amplifier arrangement.
Figure 5B:
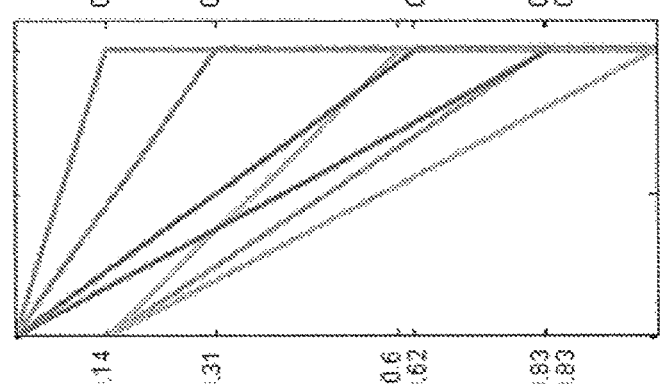
Figure 5C:
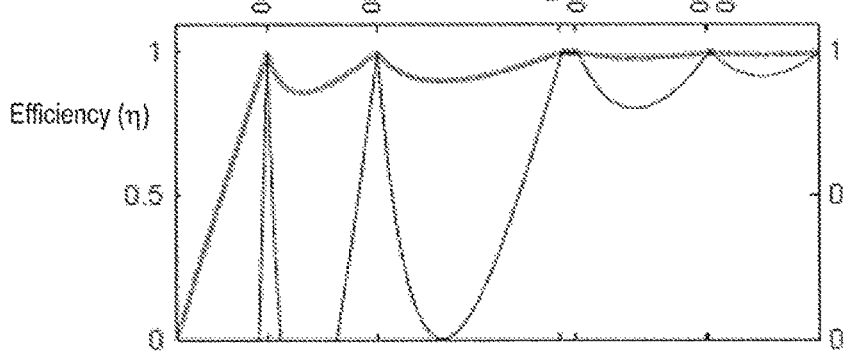

FIG. 6a shows an amplifier arrangement according to a first aspect of the present invention. In the example the amplifier arrangement comprises 4 amplifier stages, $10_1$ to $10_4$, although as will be described below the amplifier arrangement can comprise any higher number of amplifier stages, including both even and odd numbers of amplifier stages.

The amplifier arrangement comprises a cascade of quarter wavelength transmission lines $11_1$ to $11_3$ coupled between an output of an amplifier of a first amplifier stage $10_1$ and an output node 15 of the amplifier arrangement. The cascade comprises three quarter wavelength transmission lines $11_1$ to $11_3$ in this example.

An amplifier of the 4th stage $10_4$ is coupled to the output node, and remaining amplifiers between the $1^{st}$ and $4^{th}$ stages (amplifiers $10_2$ and $10_3$ in this example) are coupled to successive junctions in the cascade of quarter wavelength transmission lines $11_1$ to $11_3$.

The amplifier arrangement is configured such that the amplifier of the 4th stage $10_4$ is coupled to the output node 15 via a connecting quarter wavelength transmission line $13_1$, with each of the remaining amplifiers closest to the output node 15 apart from the first and second amplifiers $10_1$, $10_2$ (being just the amplifier of stage $10_3$ in this particular example), being coupled by a respective connecting quarter wavelength transmission line ($13_2$ in this example) to a junction of the cascade of quarter wavelength transmission lines.

The quarter wavelength transmission lines $11_1$ to $11_3$ are shown as having a decreasing characteristic impedance towards the output node 15 (represented by the comparative thickness of each quarter wavelength transmission line $11_1$ to $11_3$). Although the embodiments described herein will be described as having a cascade of quarter wavelength transmission lines with decreasing characteristic impedance towards the output node, it is noted that transformations may be provided in a network, as described later in the application, for providing the same effect as a decreasing characteristic impedance. The use of such transformations in the network might be beneficial when physical constraints are imposed on the amplifier arrangement, for example because of the physical size of the transmission lines required to give a particular characteristic impedance.

The arrangement shown in FIG. 6a can be used with an increasing number of amplifiers stages, for both odd and even numbers of amplifier stages N.

Thus, in more general terms, FIG. 6b describes this aspect of the invention for an amplifier arrangement comprising N amplifier stages, $10_1$ to $10_N$, wherein N is an integer equal or greater than four.

The amplifier arrangement comprises a cascade of quarter wavelength transmission lines $11_1$ to $11_{N-1}$ coupled between an output of an amplifier of a first amplifier stage $10_1$ and an output node 15 of the amplifier arrangement. The cascade comprises N−1 quarter wavelength transmission lines $11_1$ to $11_{N-1}$.

An amplifier of the Nth stage $10_N$ is coupled to the output node, and remaining amplifiers between the first and Nth stages $10_2$ to $10_{N-1}$ coupled to successive junctions in the cascade of quarter wavelength transmission lines $11_1$ to $11_{N-1}$.

The amplifier arrangement is configured such that the amplifier $10_N$ of the Nth stage is coupled to the output node 15 via a connecting quarter wavelength transmission line $13_1$, with each of the remaining amplifiers $10_3$ to $10_{N-1}$ of the N−2 stages closest to the output node 15 being coupled by a respective connecting quarter wavelength transmission line $13_1$ to $13_{N-2}$ to a junction of the cascade of quarter wavelength transmission lines.

The cascade of N−1 quarter wavelength transmission lines $11_1$ to $11_{N-1}$ may comprise a decreasing characteristic impedance towards the output node.

This arrangement has the advantage of providing good efficiency for high PAR signals even with equal size transistors, due to high density of transition points at low output amplitudes.

It can be seen from the above that embodiments of the present invention describe 4-stage and higher ("N-stage") amplifier arrangements, and in particular a Doherty amplifier arrangement, whereby the N−2 amplifiers closest to the output are coupled by quarter wavelength lines to the junctions of the cascade of quarter wavelength lines (consisting of N−1 quarter wavelength lines of decreasing characteristic impedance towards the output, or equivalent transformations in a network).

Figure 6C:
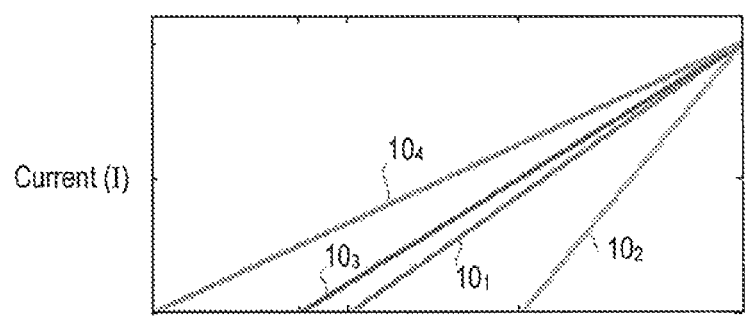
FIGS. 6c to 6e show current, voltage and efficiency curves for the amplifier arrangement of FIGS. 6a and 6b.

FIG. 6c shows a plot of current against output amplitude for the four-stage embodiment of the present invention as shown in FIG. 6a. The order of the amplifier starting points in this example is amplifier $10_4$ starting at zero, amplifier $10_3$ starting at 0.25 of full output amplitude, amplifier $10_1$ starting at 0.33 of full output amplitude, and amplifier $10_2$ starting at 0.62 of full output amplitude.

Figure 6D:
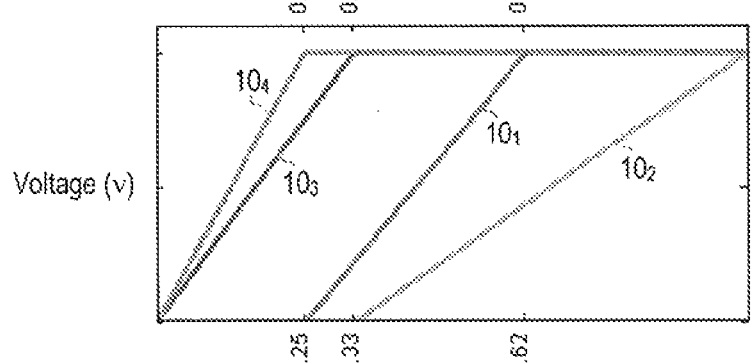

FIG. 6d shows a plot of voltage against output amplitude for the four-stage embodiment of the present invention as shown in FIG. 6a.

Figure 6E:
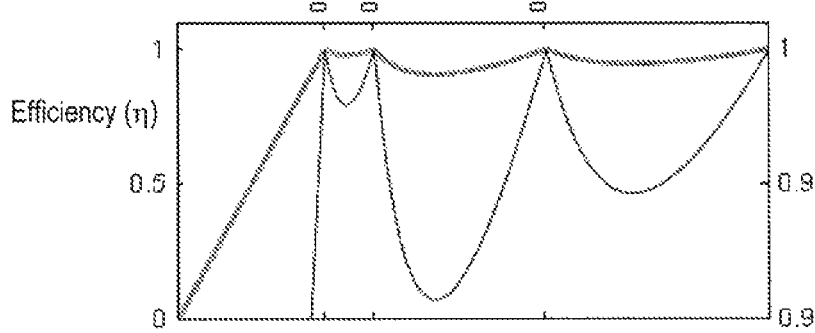

FIG. 6e shows a plot of efficiency against output amplitude for the four-stage embodiment of the present invention as shown in FIG. 6a.

It can be seen from the above that the amplifier stages (transistors, constituent amplifiers) connected to the output node 15 (i.e. amplifier $10_4$) and to the quarterwave cascade junction one quarter wavelength from the output (i.e. amplifier $10_3$) are connected via quarter wave lines. This is different from a regular multistage Doherty amplifier arrangement in which no such quarter wave lines are used. The quarterwave cascade itself contains three quarter wavelength lines, whereas the arrangement in prior art systems such as EP2403135 only have one quarterwave-connected stage, at the output, and a quarterwave cascade consisting of only two quarter wave lines.

It can be seen from FIG. 6c that the current amplitudes are zero below, and (piecewise) linear above respective transition points (and zero). All current amplitudes are then linear up to the maximum output.

With increasing amplitude, a new amplifier needs to start delivering current only when a previous amplifier has reached its maximum voltage (saturation). As for all Doherty amplifiers, the RF output voltages and currents at an amplifier stage are always in phase in the ideal implementation (and at center frequency).

The relative phases of the drive signals to the amplifiers are easily found by inspection of the electrical length from each amplifier to the common output node 15 (i.e. time delay over the lengths of transmission line). In this specific example, amplifiers $10_2$ and $10_3$ of the second and third amplifier stages are configured to have phase offsets of −90 degrees (a quarter RF cycle) relative to the phase of amplifier $10_4$ of the fourth amplifier stage, and amplifier $10_1$ of the first amplifier stage configured to have a phase offset of −180 degrees (a half RF cycle). At least for wideband implementations the offsets can be implemented as time delays (which is also convenient for microwave implementations, where they can be implemented with transmission lines).

In the example of FIG. 6a each of the amplifiers in the amplifier stages ($10_1$ to $10_4$) is of a substantially equal size. By substantially equal size is meant that the amplifiers may be of the same generally type, or that the amplifiers may be configured to provide similar drive currents and/or voltages.

Furthermore, in this example the characteristic impedance of each successive stage in the cascade of quarter wavelength transmission lines $11_1$ to $11_3$ is reduced towards the output node, and in particular reduced to the parallel combination of the preceding connecting transmission lines. For example, for equal connecting characteristic impedance it reduces to 1/M of the impedance of the transmission line from a single amplifier, where M is the number of preceding amplifiers (i.e. amplifier connected to the input side of a particular point). Therefore, in an example where a particular point has two preceding amplifiers connected by equal connecting characteristic impedances, the characteristic impedance is halved (1/M=½).

Also, in this example, the characteristic impedance of each of the connecting quarter wavelength transmission lines $13_1$ to $13_2$ is substantially equal.

Referring to FIG. 6e, the efficiency curve for such an amplifier arrangement designed for four equal size transistors (and substantially the same characteristic impedance in the connecting transmission lines and/or connecting part of the quarterwave cascade junction) has four peaks; at 0.25, 0.33, 0.62 and 1 of full output amplitude.

Figure 6F:
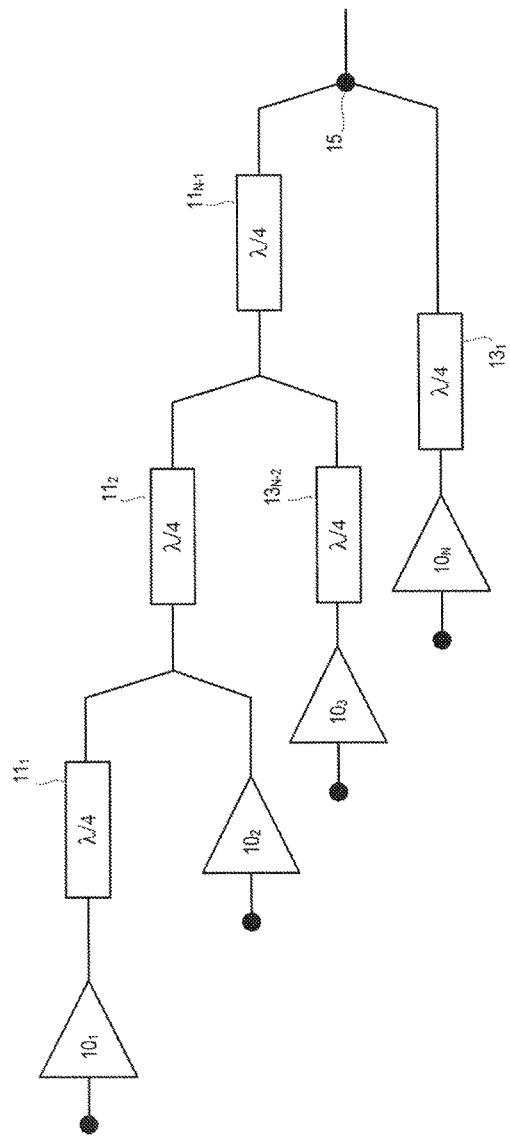
FIG. 6f shows a schematic diagram of the amplifier arrangement according to an embodiment of FIGS. 6a and 6b.

FIG. 6f shows a schematic diagram of the embodiment of FIG. 6a, illustrated in an alternative manner. Similar schematic diagrams can be drawn for the other embodiments that are described below.

Figure 7:
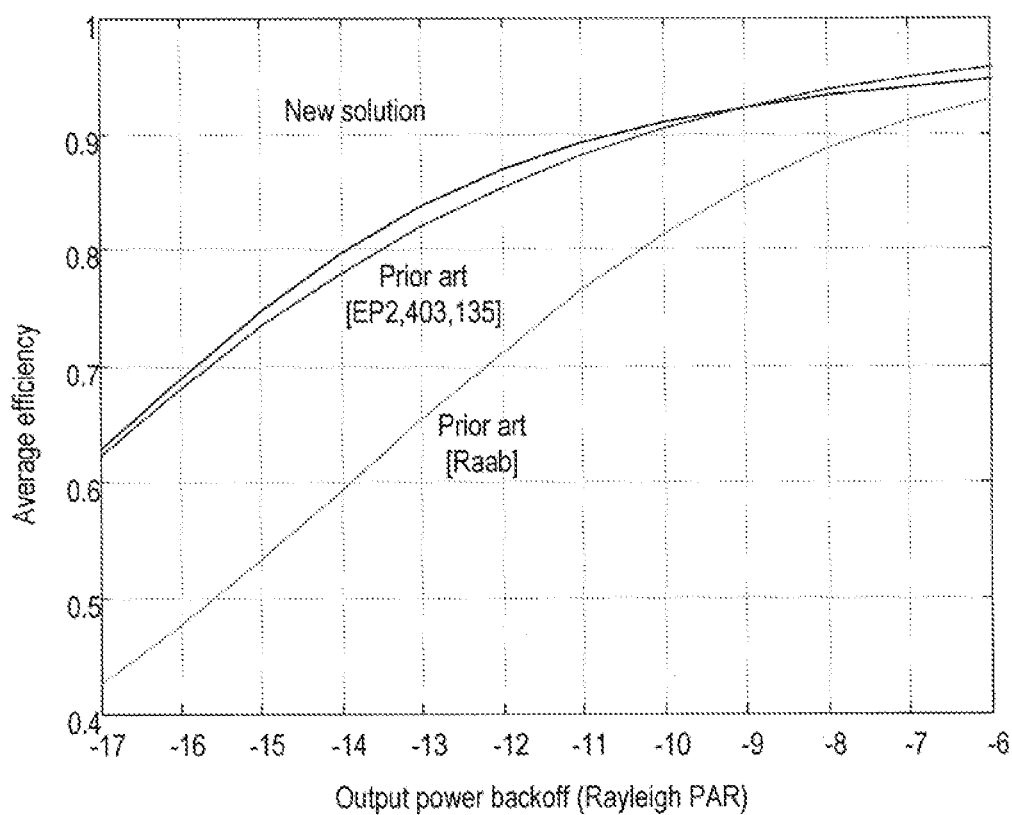
FIG. 7 compares average efficiency between an embodiment of the present invention and prior art solutions.

The arrangements shown in FIGS. 6a, 6b and 6f above have the advantage of being more efficient than prior art solutions for signals with Rayleigh distributed amplitudes with PAR above 9 dB, as seen in FIG. 7 which compares efficiency curves for the present embodiment with that of EP2,403,135 and the paper by Raab (whereby the x-axis is back off counted as negative PAR for a signal with Rayleigh distributed amplitude).

Correctly tuned amplifiers have high, ideally infinite, impedance at the output. This high impedance is transformed by a quarterwave line so that the other end has a low (close to short circuit) impedance. Since the amplifier $10_4$ of FIG. 6a is connected by a quarterwave line to the output node 15, the output is thus short circuited when seen from amplifiers in the quarterwave cascade. In analogy with the traditional 2-stage Doherty amplifier, the amplifiers in the quarterwave cascade thus work together as an equivalent peaking amplifier to the fourth amplifier $10_4$, which consequentially works as a main, or carrier, amplifier.

In the quarterwave cascade, the same situation holds for the third amplifier $10_3$ relative to the others. The amplifier $10_3$ is connected by a quarterwave line to a junction in the quarterwave cascade. Therefore, this connection point is short circuited for RF voltage from the other amplifiers. These then act together as a peaking amplifier for the third amplifier $10_3$ (i.e. "a peaking amplifier to the peaking amplifier"). The quarter wavelength transmission line of the first amplifier $10_1$ short circuits the connection point for the second amplifier $10_2$, which in the same way acts as a peaking amplifier for the first amplifier $10_1$. The short circuiting of the connection points is the reason for the quarterwave cascade; a short circuited junction is displaced from the next by a quarter wavelength line that transforms the low impedance to an open circuit or high impedance.

According to other embodiments of the invention, this scheme can be extended with good results to higher numbers of stages. This is achieved by using the N-stage amplifier, with the quarterwave cascade extended by an extra quarter wavelength (to the right), as the peaking amplifier for an (N+1)-stage. This is always possible, regardless of whether the starting N was even or odd. Higher order versions therefore exist for all numbers of stages, odd and even, contrary to prior art solutions. All higher order versions also have the advantageous property of having many transition points rather evenly distributed in the low amplitude range, for equal size transistors.

FIG. 8a shows an example of an amplifier arrangement comprising five amplifier stages $10_1$ to $10_5$, i.e. N=5.

The amplifier arrangement comprises a cascade of quarter wavelength transmission lines $11_1$ to $11_4$ coupled between an output of an amplifier of a first amplifier stage $10_1$ and an output node 15 of the amplifier arrangement. The cascade comprises four (N−1) quarter wavelength transmission lines $11_1$ to $11_4$ of decreasing characteristic impedance towards the output node.

An amplifier of the fifth stage $10_5$ is coupled to the output node 15, and remaining amplifiers between the first and fifth stages, i.e. the amplifiers of stages $10_2$ to $10_4$, coupled to successive junctions in the cascade of quarter wavelength transmission lines $11_1$ to $11_4$.

The amplifier arrangement is configured such that the amplifier $10_5$ of the fifth stage is coupled to the output node 15 via a connecting quarter wavelength transmission line $13_1$, with each of the remaining amplifiers of the three stages closest to the output node 15 (i.e. amplifiers $10_3$ and $10_4$ in this example) being coupled by a respective connecting quarter wavelength transmission line $13_2$ and $13_3$ to a junction of the cascade of quarter wavelength transmission lines.

Figure 8B:
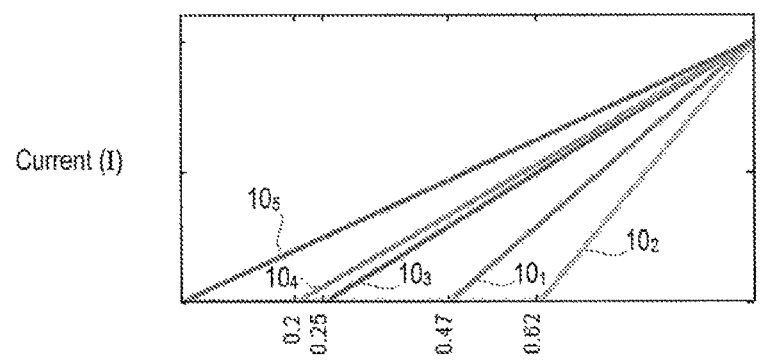

FIG. 8b shows a plot of current against output amplitude for the five-stage embodiment of the present invention as shown in FIG. 8a. The order of the amplifier starting points in this example is amplifier $10_5$ starting at zero, amplifier $10_4$ starting at 0.2 of full output amplitude, amplifier $10_3$ starting at 0.25 of full output amplitude, amplifier $10_1$ starting at 0.47 of full output amplitude, and amplifier $10_2$ starting at 0.62 of full output amplitude.

Also, in this case (and as we will see, in general) all current amplitudes shown in FIG. 8b are linear from their starting points up to the maximum output. This has the advantage of making the drive signals easier to achieve, since no amplitude limiting is necessary.

Figure 8C:
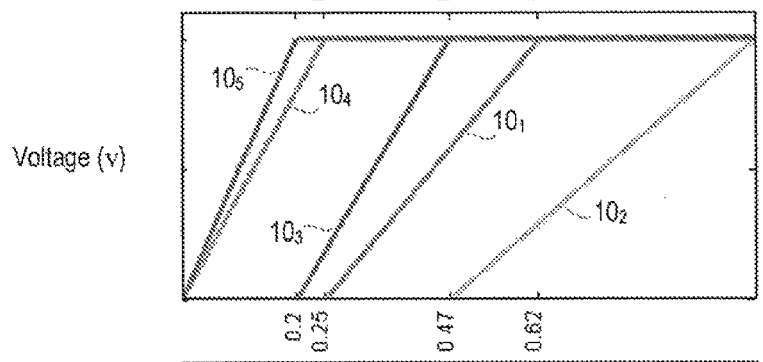

FIG. 8c shows the voltages of the respective amplifier stages $10_1$ to $10_5$ relative to full output amplitude.

Figure 8D:
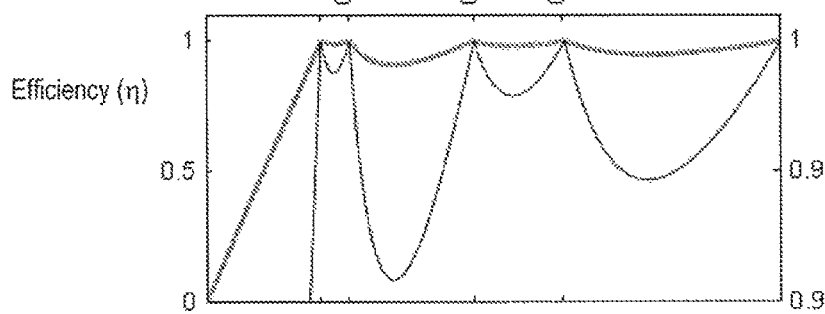
Figure 9:
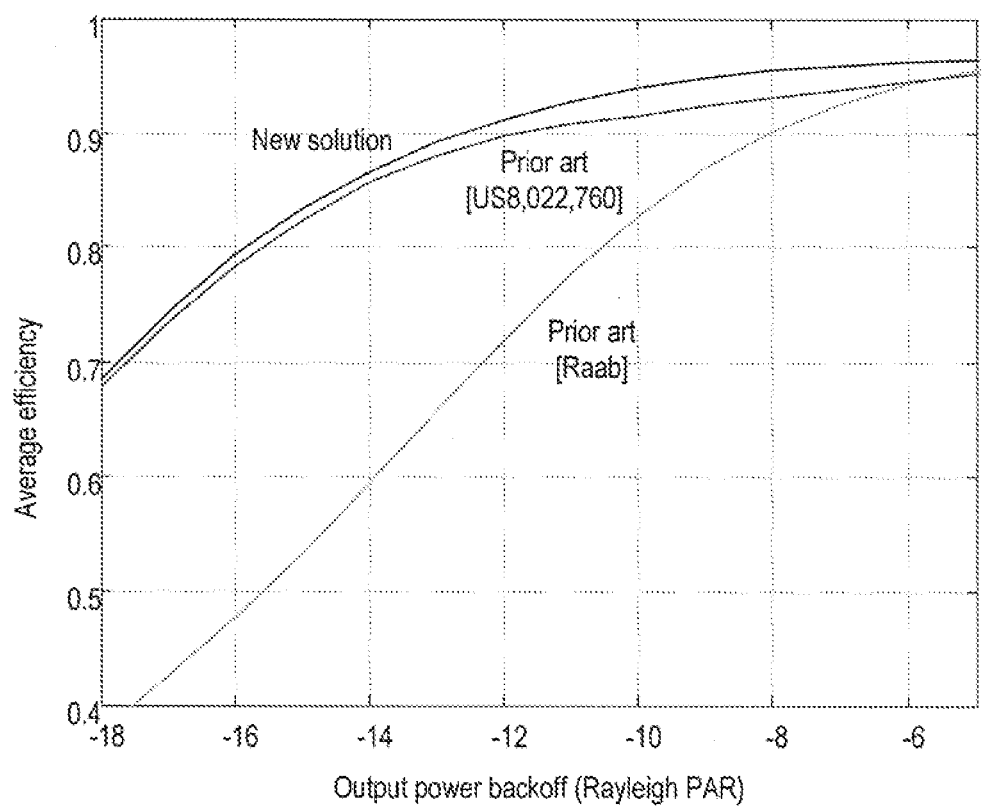
FIG. 9 compares average efficiency between an embodiment of the present invention and prior art solutions.

Referring to FIG. 8d, the efficiency curve for an amplifier designed for five equal size transistors has five peaks; at 0.20, 0.25, 0.47, 0.62 and 1 of full output amplitude. This distribution of transition points is advantageous for high-PAR signals, and better that the prior art solutions for all relevant Rayleigh PAR values, as shown in FIG. 9.

Figure 10A:
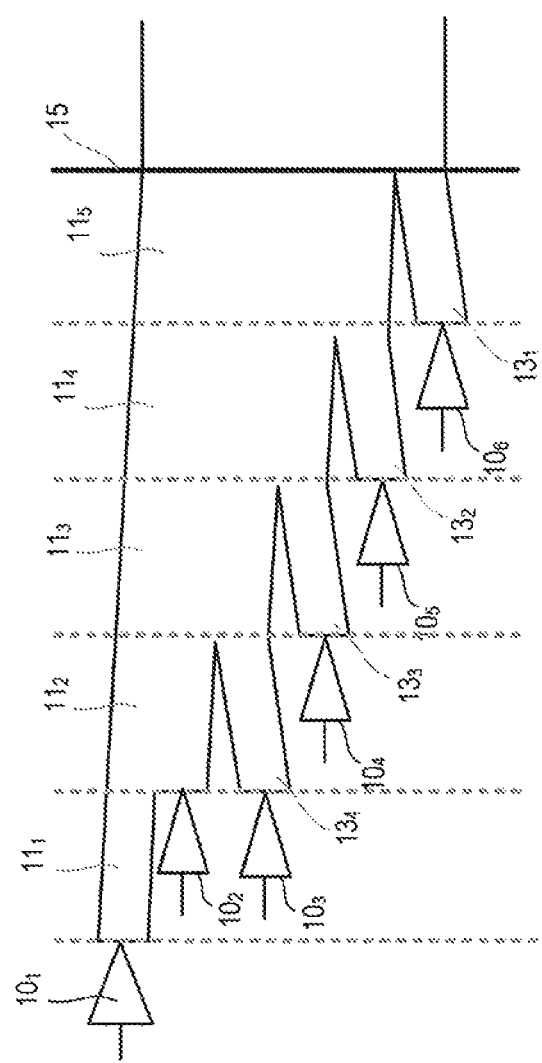
FIG. 10a shows an amplifier arrangement according to an embodiment of the present invention.

FIG. 10a shows an example of an amplifier arrangement comprising six amplifier stages $10_1$ to $10_6$, i.e. N=6.

The amplifier arrangement comprises a cascade of quarter wavelength transmission lines $11_1$ to $11_5$ coupled between an output of an amplifier of a first amplifier stage $10_1$ and an output node 15 of the amplifier arrangement. The cascade comprises five (N−1) quarter wavelength transmission lines $11_1$ to $11_5$ of decreasing characteristic impedance towards the output node.

An amplifier of the sixth stage $10_6$ is coupled to the output node 15, and remaining amplifiers between the first and sixth stages, i.e. the amplifiers of stages $10_2$ to $10_5$ in this example, coupled to successive junctions in the cascade of quarter wavelength transmission lines $11_1$ to $11_5$.

The amplifier arrangement is configured such that the amplifier $10_6$ of the sixth stage is coupled to the output node 15 via a connecting quarter wavelength transmission line $13_1$, with each of the remaining amplifiers of the four stages closest to the output node 15 (i.e. amplifiers $10_3$ to $10_5$ in this example) being coupled by a respective connecting quarter wavelength transmission line $13_2$ to $13_4$ to a junction of the cascade of quarter wavelength transmission lines.

Figure 10B:
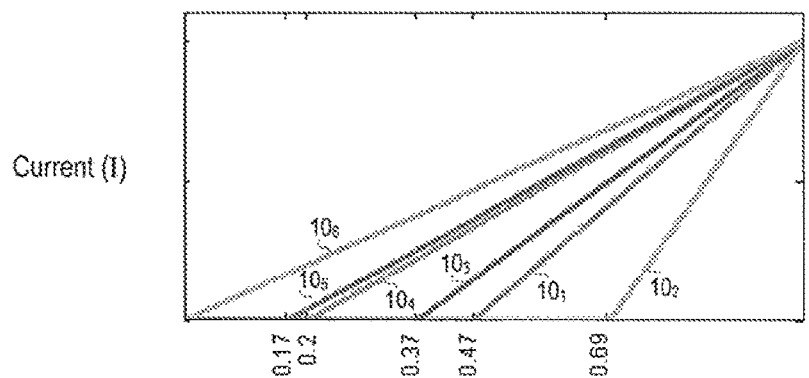

FIG. 10b shows a plot of current against output amplitude for the six-stage embodiment of the present invention as shown in FIG. 10a. The order of the amplifier starting points in this example is amplifier $10_6$ starting at zero, amplifier $10_5$ starting at 0.17 of full output amplitude, amplifier $10_4$ starting at 0.2 of full output amplitude, amplifier $10_3$ starting at 0.37 of full output amplitude, amplifier $10_1$ starting at 0.47 of full output amplitude, and amplifier $10_2$ starting at 0.69 of full output amplitude.

Also, in this case all current amplitudes shown in FIG. 10b are linear from their starting points up to the maximum output. This has the advantage of making the drive signals easier to achieve, since no amplitude limiting is necessary.

Figure 10C:
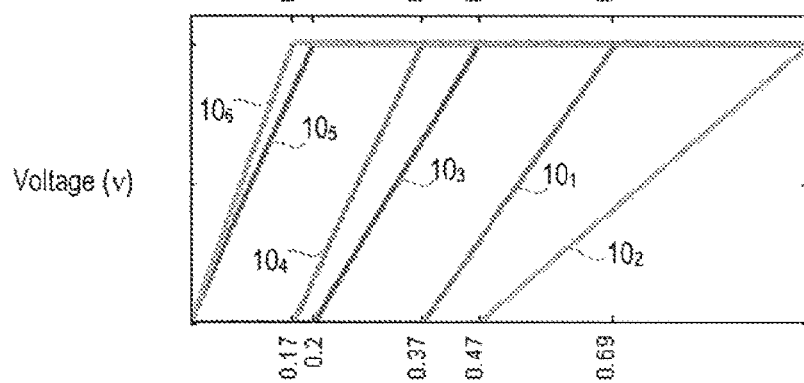

FIG. 10c shows the voltages of the respective amplifier stages $10_1$ to $10_6$ relative to full output amplitude.

Figure 10D:
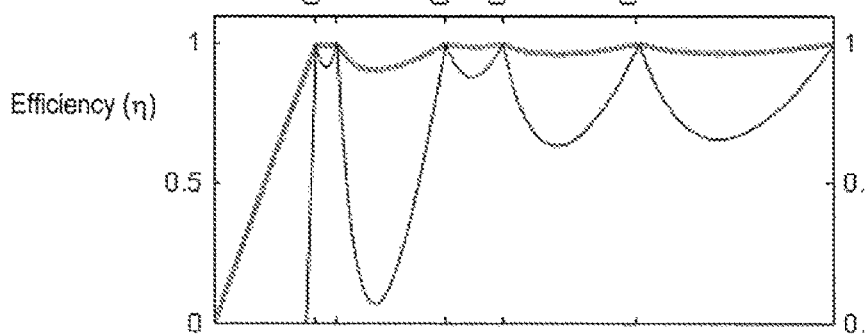
Figure 11:
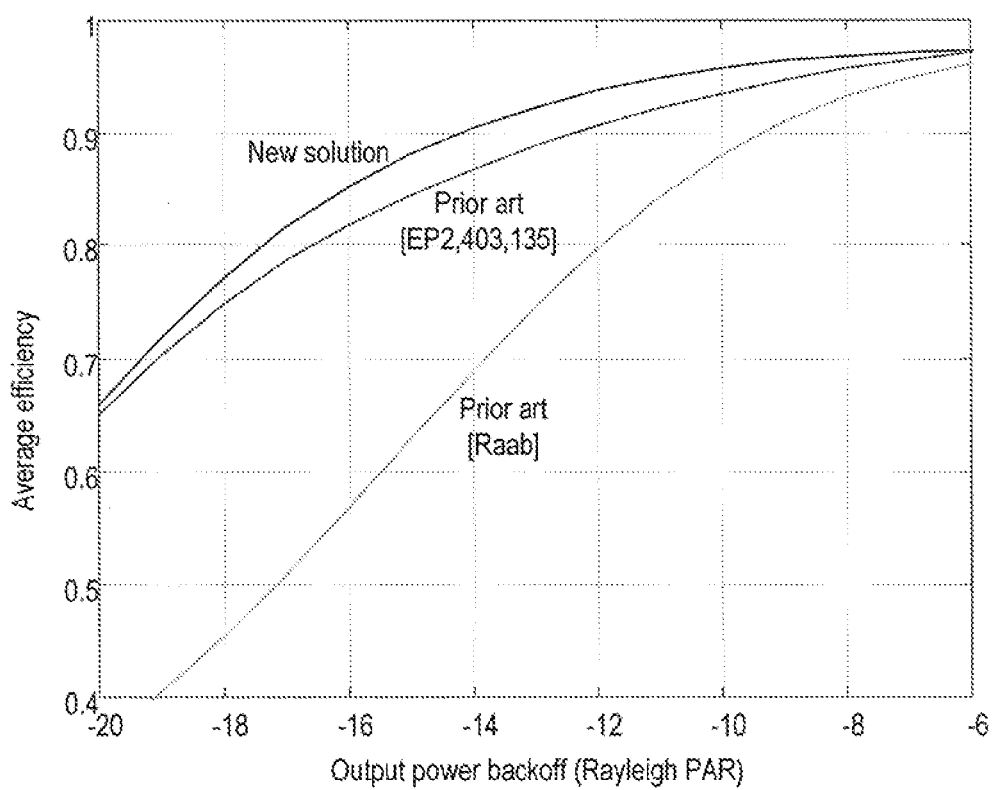
FIG. 11 compares average efficiency between an embodiment of the present invention and prior art solutions.

Referring to FIG. 10d, this shows the efficiency curve, using six transistors of substantially equal size, having six peaks; at 0.17, 0.20, 0.37, 0.47, 0.69 and 1 of full output amplitude. This distribution of transition points is advantageous for high-PAR signals, and improved compared to the prior art solutions for essentially all Rayleigh PAR values, as shown in FIG. 11.

Embodiments for an increasing number of amplifier stages can be configured in a similar manner to the embodiments of FIGS. 6a, 8a, and 10a.

Figure 12:
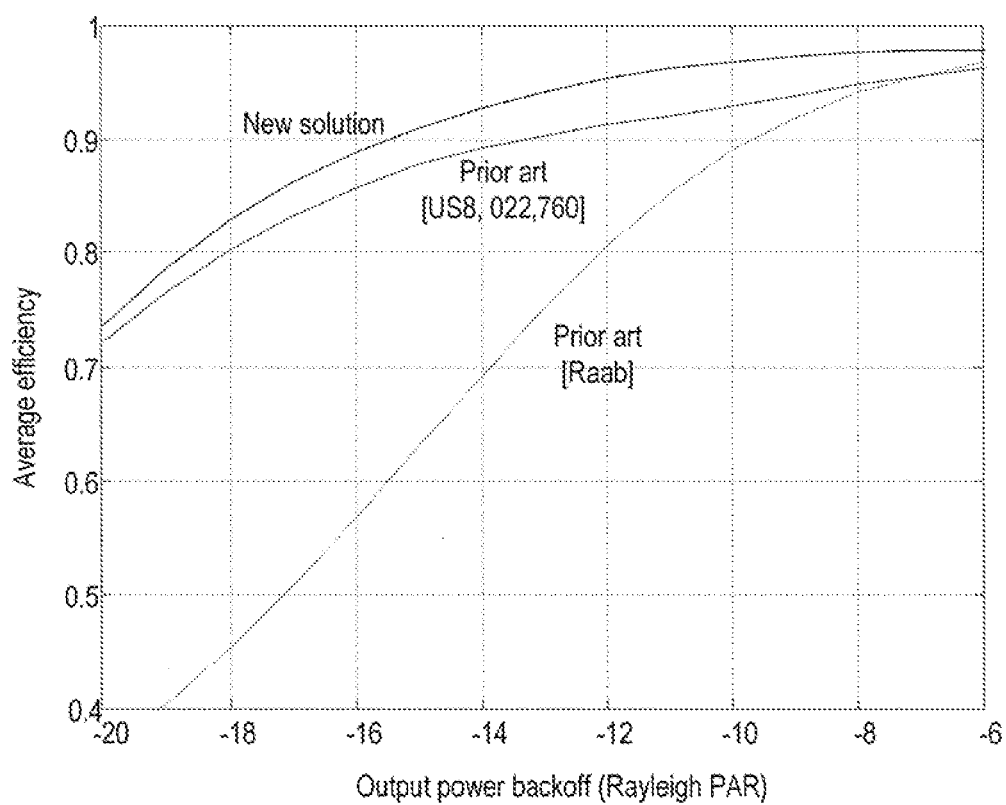
FIGS. 12 to 15 compare average efficiency between embodiments of the present invention and prior art solutions.

FIG. 12 compares the efficiency of a 7-stage amplifier arrangement with prior art solutions (all designed for substantially equal sized transistors or amplifiers).

Figure 13:
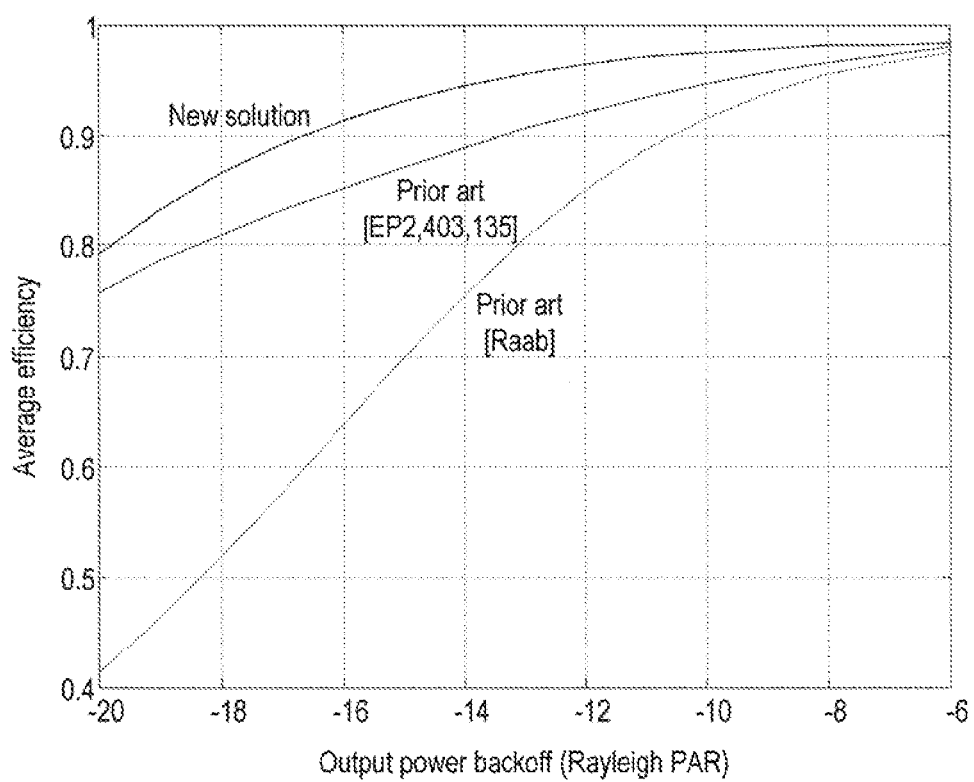

FIG. 13 compares the efficiency of a 8-stage amplifier arrangement with prior art solutions (all designed for substantially equal sized transistors or amplifiers).

Figure 14:
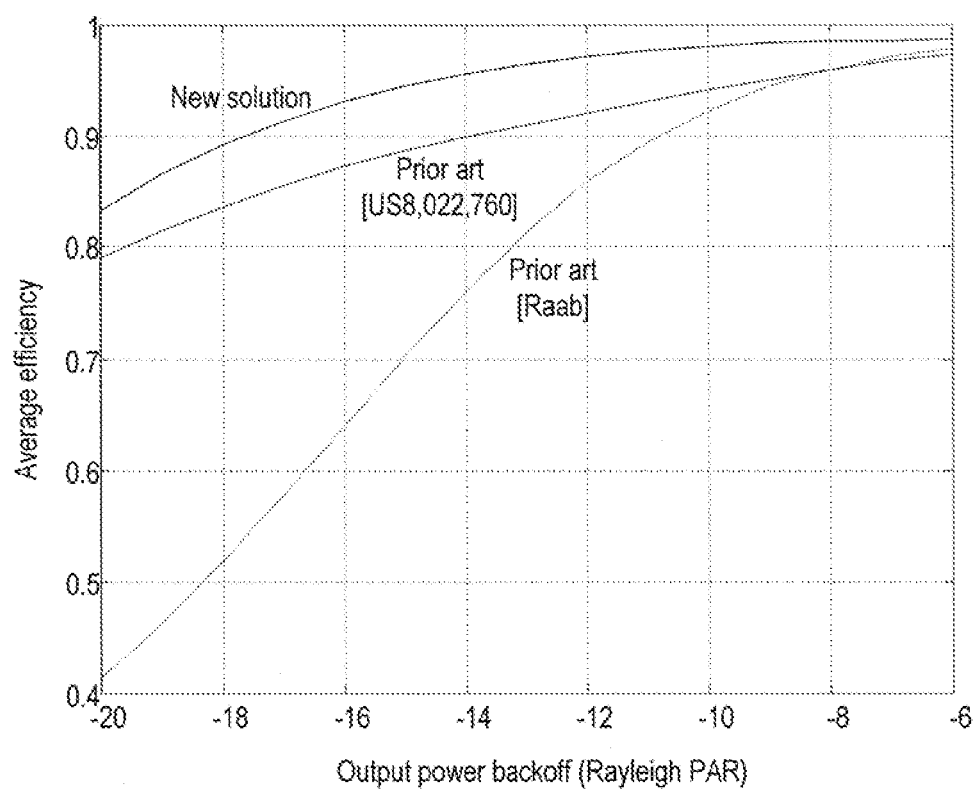

FIG. 14 compares the efficiency of a 9-stage amplifier arrangement with prior art solutions (all designed for substantially equal sized transistors or amplifiers).

Figure 15:
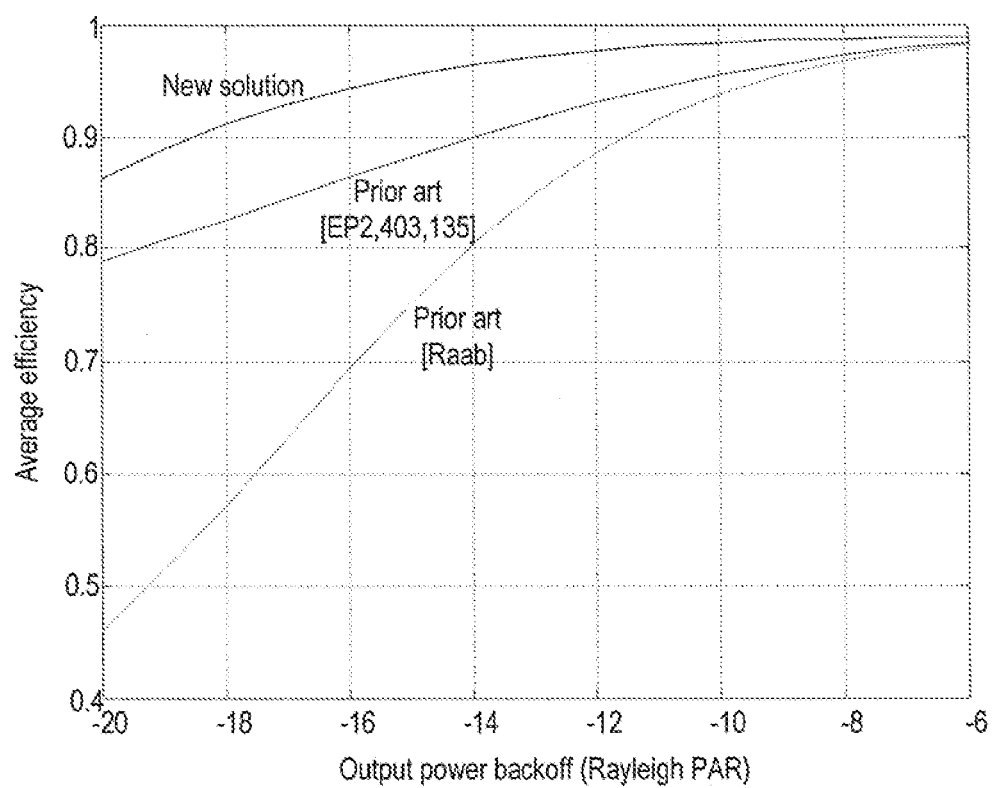

FIG. 15 compares the efficiency of a 10-stage amplifier arrangement with prior art solutions (all designed for substantially equal sized transistors or amplifiers).

It can be seen from the above that the embodiments of the invention thus perform generally better than prior art Doherty amplifiers in relation to average efficiency for high-PAR signals. It is noted that the relative advantage increases with increasing numbers of amplifier stages.

According to another aspect of the present invention, the transition points at which amplifier stages switch into operation can be distributed more evenly.

This improved distribution of transition points may be achieved by making the starting amplifier, i.e. the transistor closest to the output (the Nth amplifier stage of the embodiments described above), smaller compared to the others. For example, according to one example the Nth amplifier is made about half the size (e.g. half the output current rating) compared to the remaining amplifiers. In such an embodiment the connecting quarter wavelength transmission line $13_1$ from the Nth amplifier $10_N$ (i.e. from $10_4$) is increased compared to the characteristic impedance of the other connecting quarter wavelength transmission lines $13_1$ to $13_{N-2}$ (as illustrated by the reduced comparative thickness of $13_1$). For example, in an example where the size of the Nth amplifier is halved, the characteristic impedance of the corresponding connecting quarter wavelength transmission line can be twice the characteristic impedance of the other connecting quarter wavelength transmission lines.

Figure 16A:
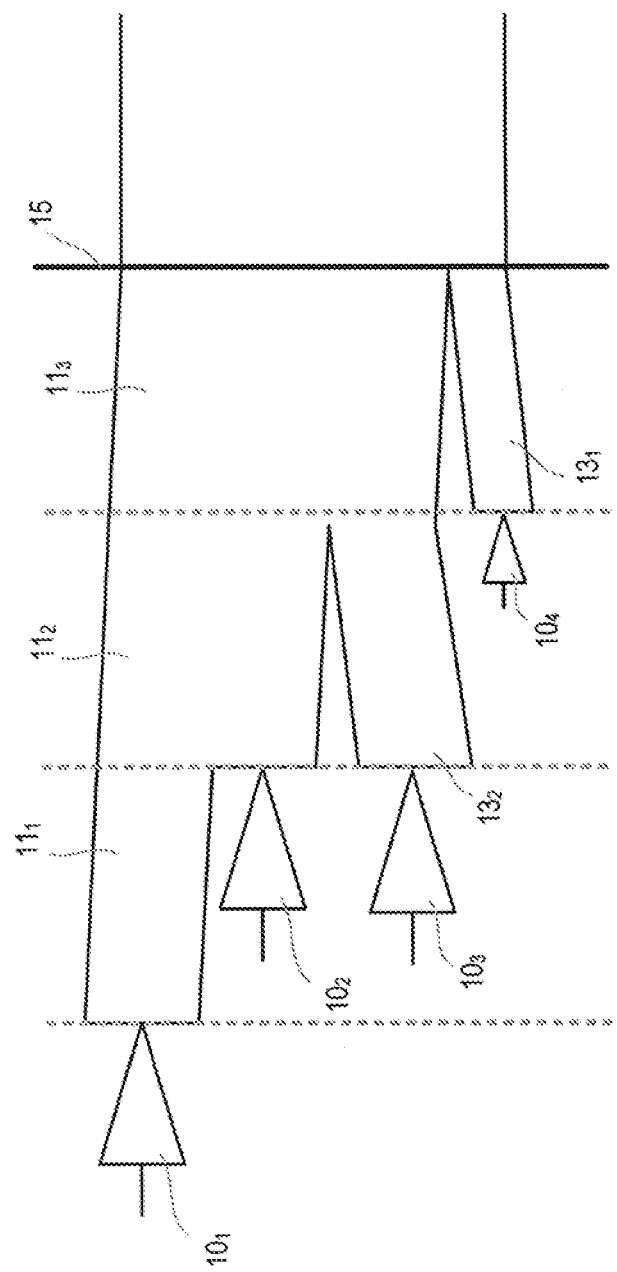
FIG. 16a shows an amplifier arrangement according to an embodiment of the present invention.

FIG. 16a shows such a configuration for a 4-stage amplifier, although it is noted that this aspect can be used with any number of stages of four and above.

As with the four stage example of FIG. 6a, FIG. 16a shows an amplifier arrangement comprising four amplifier stages, $10_1$ to $10_4$, and a cascade of quarter wavelength transmission lines $11_1$ to $11_3$ coupled between an output of an amplifier of a first amplifier stage $10_1$ and an output node 15 of the amplifier arrangement. The cascade comprises three quarter wavelength transmission lines $11_1$ to $11_3$ in this example, of decreasing characteristic impedance towards the output node.

An amplifier of the 4th stage $10_4$ is coupled to the output node, and remaining amplifiers between the $1^{st}$ and 3rd stages (amplifiers $10_2$ and $10_3$ in this example) are coupled to successive junctions in the cascade of quarter wavelength transmission lines $11_1$ to $11_3$.

The amplifier arrangement is configured such that the amplifier of the 4th stage $10_4$ is coupled to the output node 15 via a connecting quarter wavelength transmission line $13_1$, with each of the remaining amplifiers closest to the output node 15 apart from the first and second amplifiers $10_1$, $10_2$ (being just the amplifier of stage $10_3$ in this example), being coupled by a respective connecting quarter wavelength transmission line ($13_2$ in this example) to a junction of the cascade of quarter wavelength transmission lines.

According to the embodiment of FIG. 16a the amplifier in the Nth amplifier stage $10_N$ (closest to the output node), i.e. the fourth amplifier $10_4$, is reduced in size compared to the other amplifiers in the other amplifier stages $10_1$ to $10_{N-1}$. The characteristic impedance of the connecting quarter wavelength transmission line $13_1$ coupling the amplifier in the Nth amplifier stage to the output node is increased by a corresponding ratio compared to the characteristic impedance of each of the other connecting quarter wavelength transmission lines $13_2$ to $13_{N-2}$, (i.e. compared to $13_2$ in this example).

For example, in one embodiment the amplifier in the Nth amplifier stage $10_N$ is substantially halved in size compared to the other amplifiers in the other amplifier stages $10_1$ to $10_{N-1}$, and wherein the characteristic impedance of the connecting quarter wavelength transmission line $13_1$ coupling the amplifier in the Nth stage to the output node is substantially doubled in size compared to the characteristic impedance of each of the other connecting quarter wavelength transmission lines $13_2$ to $13_{N-2}$.

Figure 16B:
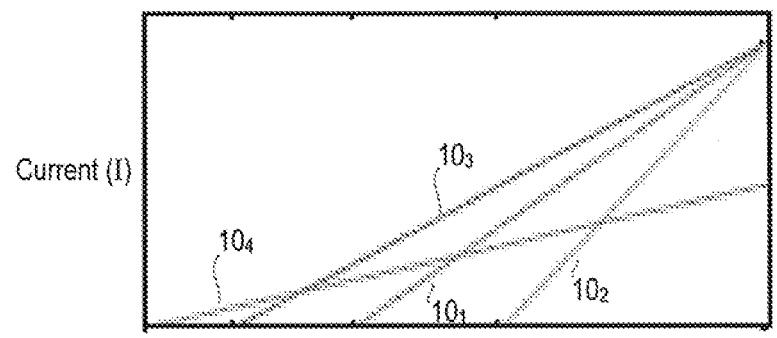

This has the advantage that the smaller amplifier in the stage closest to the output node allows the distribution of transition points to be improved, as reflected in FIG. 16b, whereby the transition points occur at 0.14, 0.33 and 0.57 of full output amplitude, thus being more evenly spread than the previous embodiments.

Figure 16C:
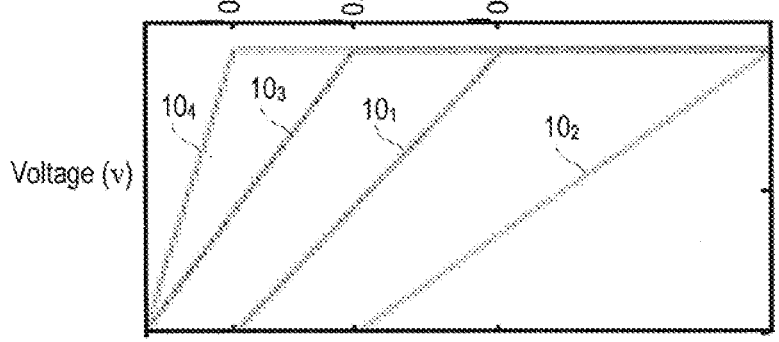

FIG. 16c shows the voltages of the respective amplifier stages $10_1$ to $10_4$ relative to full output amplitude.

Figure 16D:
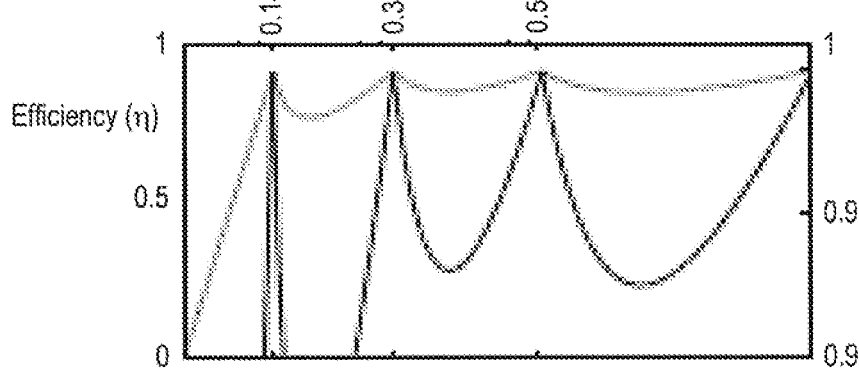
Figure 17A:
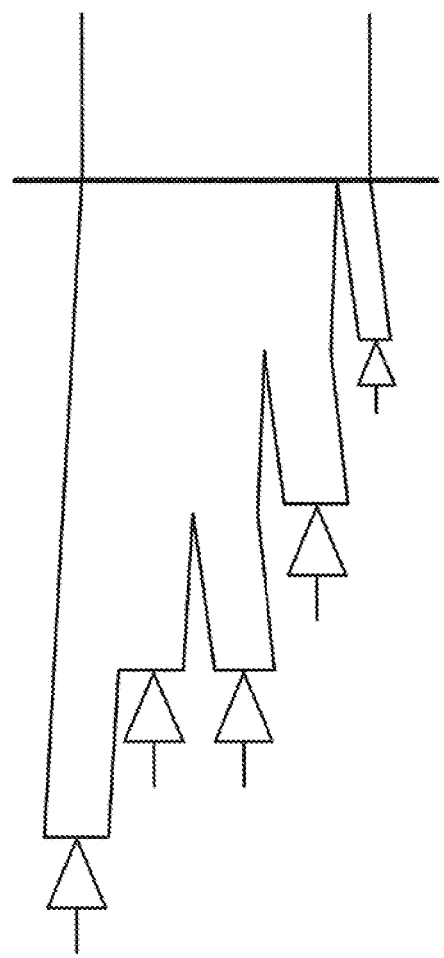
Figure 18B:
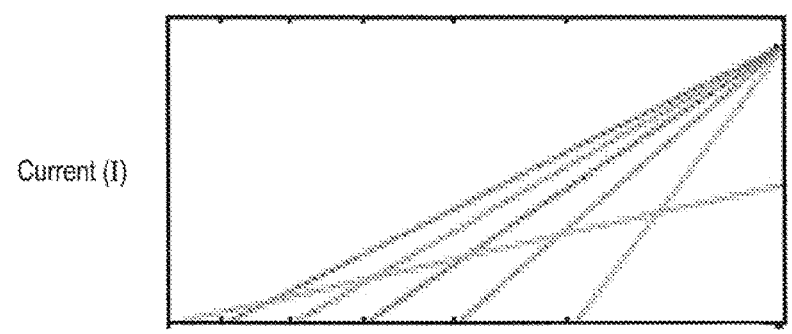
Figure 18C:
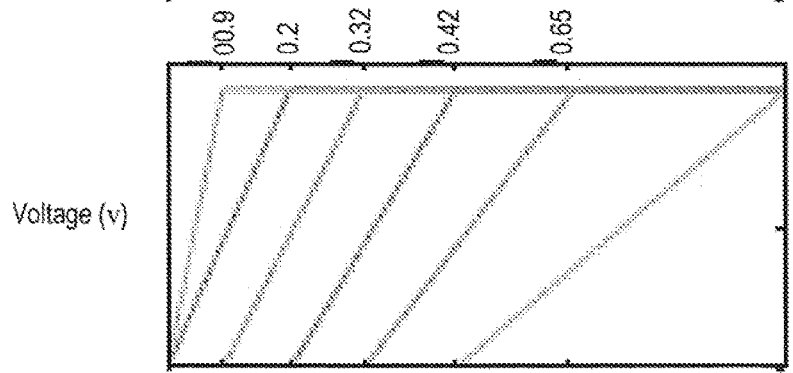
Figure 18D:
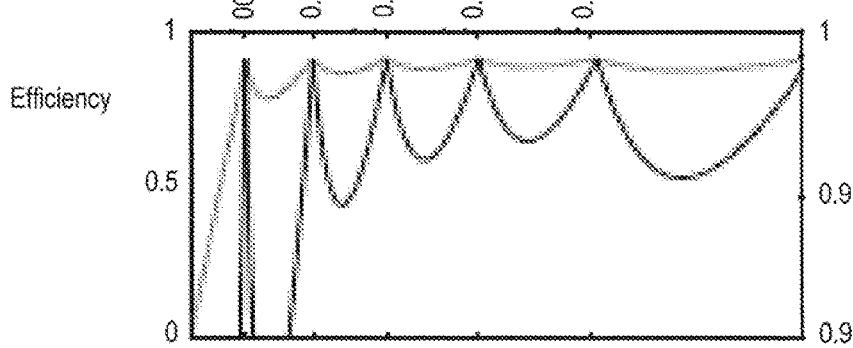
Figure 20A:
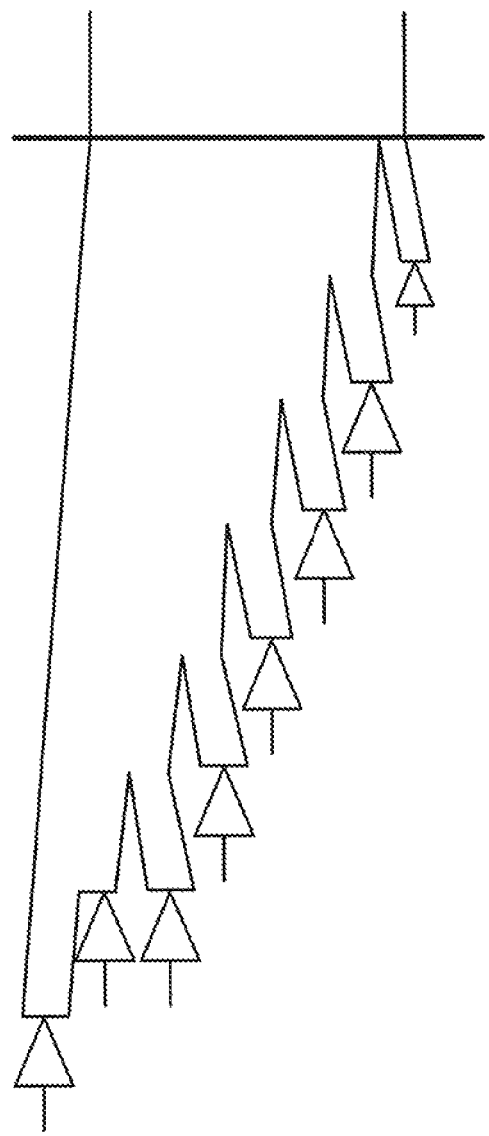
Figure 20B:
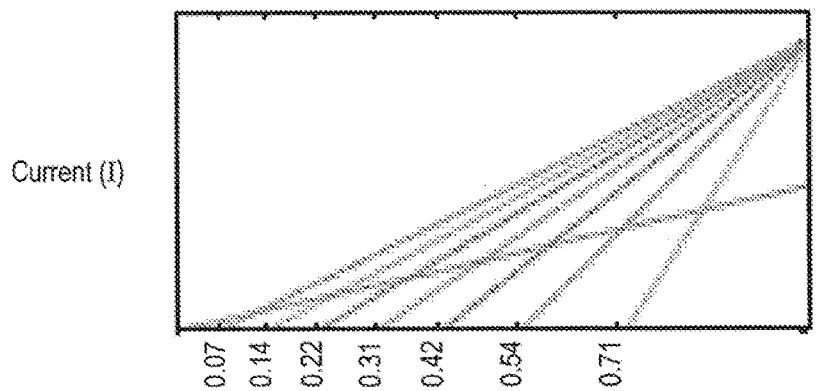
Figure 20C:
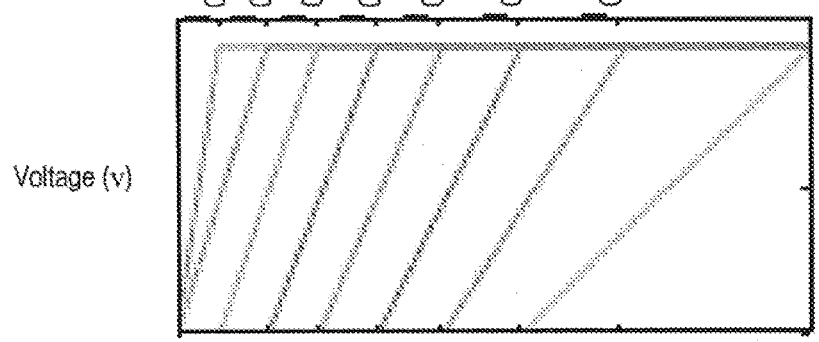
Figure 20D:
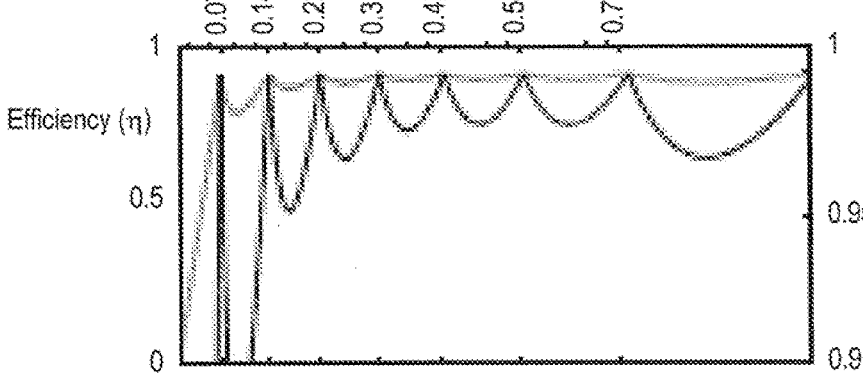
Figure 21B:
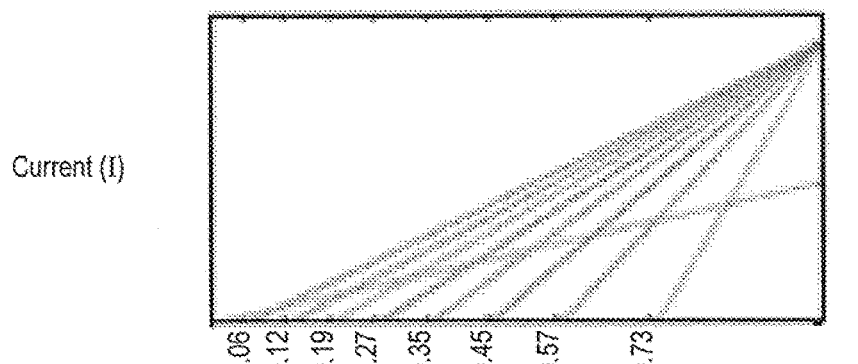
Figure 21C:
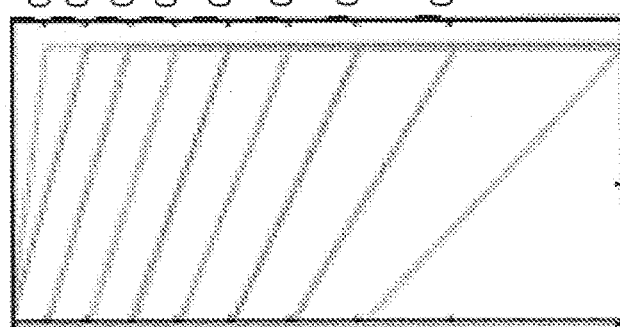
Figure 21D:
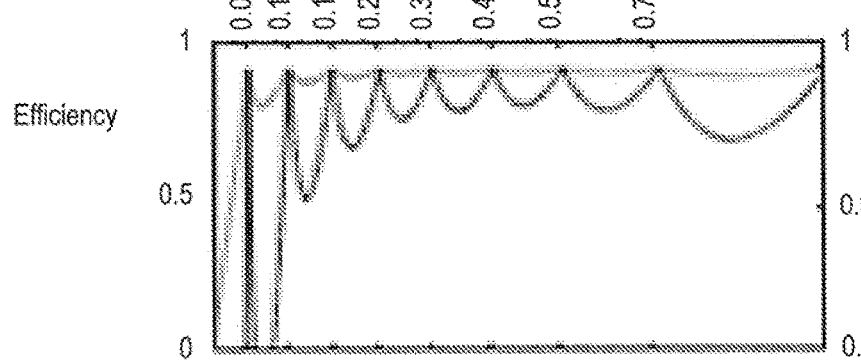
Figure 22A:
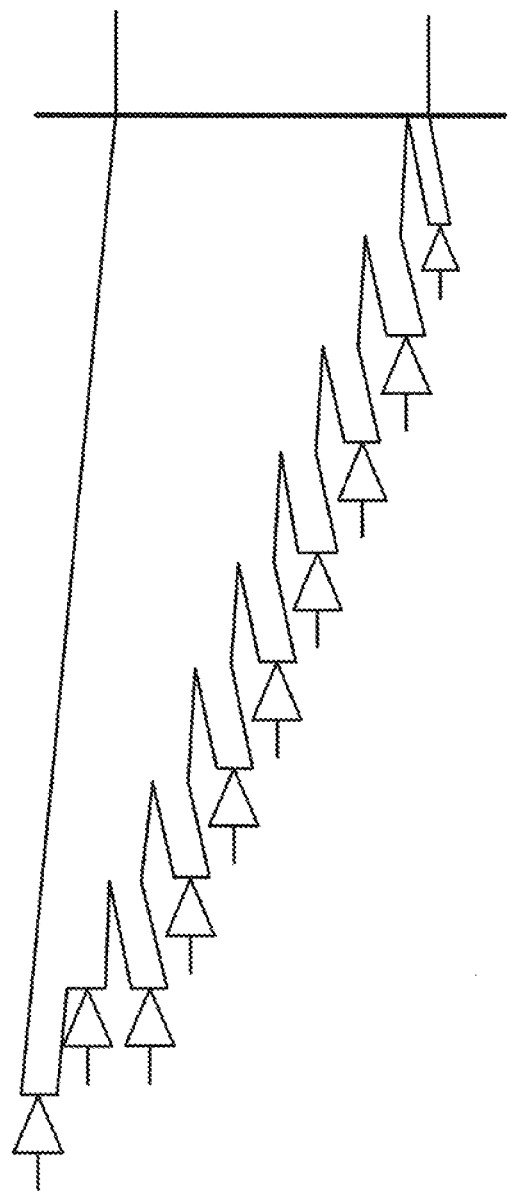
Figure 22B:
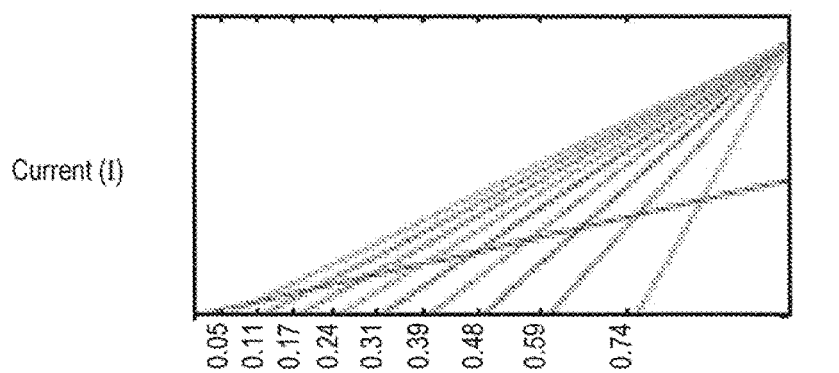
Figure 22C:
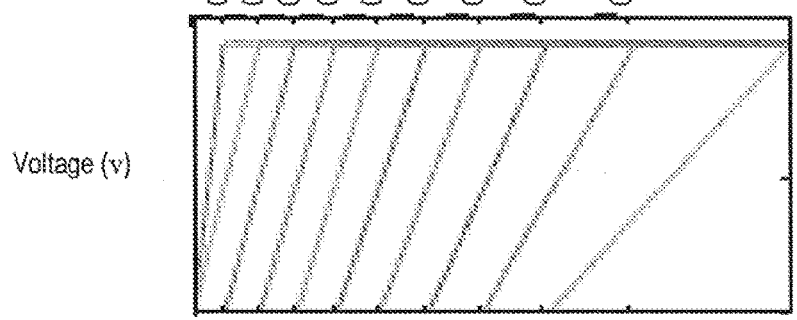
Figure 22D:
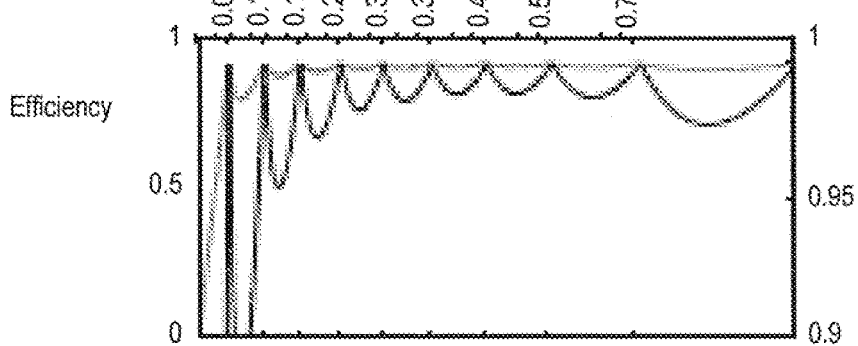

Referring to FIG. 16d, the efficiency curve for such an amplifier designed for four amplifier stages with the closest to the output being smaller in size has four peaks; at 0.14, 0.33, 0.57, 0.62 and 1 of full output amplitude. This distribution of transition points is advantageous for high-PAR signals, and better that the prior art solutions for all relevant Rayleigh PAR values. In particular, such an evenly distribution of transition points would generally require more different sizes of transistors if prior art Doherty amplifiers were used.

The same advantageous property is consistently achieved for higher numbers of stages, as shown in FIGS. 17a-17d for a 5-stage amplifier, FIGS. 18a-18d for a 6-stage amplifier, FIGS. 19a-19d for a 7-stage amplifier, FIGS. 20a-20d for a 8-stage amplifier, FIGS. 21a-21d for a 9-stage amplifier, and FIGS. 22a-22d for a 10-stage amplifier. The same applies for higher orders of amplifier stages.

These embodiments have the advantage that the entire set of transition points become evenly distributed even though the size of only one amplifier is changed, for example halved, thus enabling the construction of the amplifier arrangement to be simplified.

According to another aspect of the present invention, another way to achieve a more even distribution of efficiency peaks is by increasing the size of the amplifier second closest to the output (also known as the "first peaking amplifier") relative to the other amplifiers, For example, according to one embodiment this amplifier may be increased by 25-50% relative to the other amplifiers. In such an embodiment the characteristic impedance of the respective connecting quarter wavelength transmission line $13_2$ is decreased by some corresponding function (as illustrated by the increased comparative thickness of $13_2$).

Figure 23A:
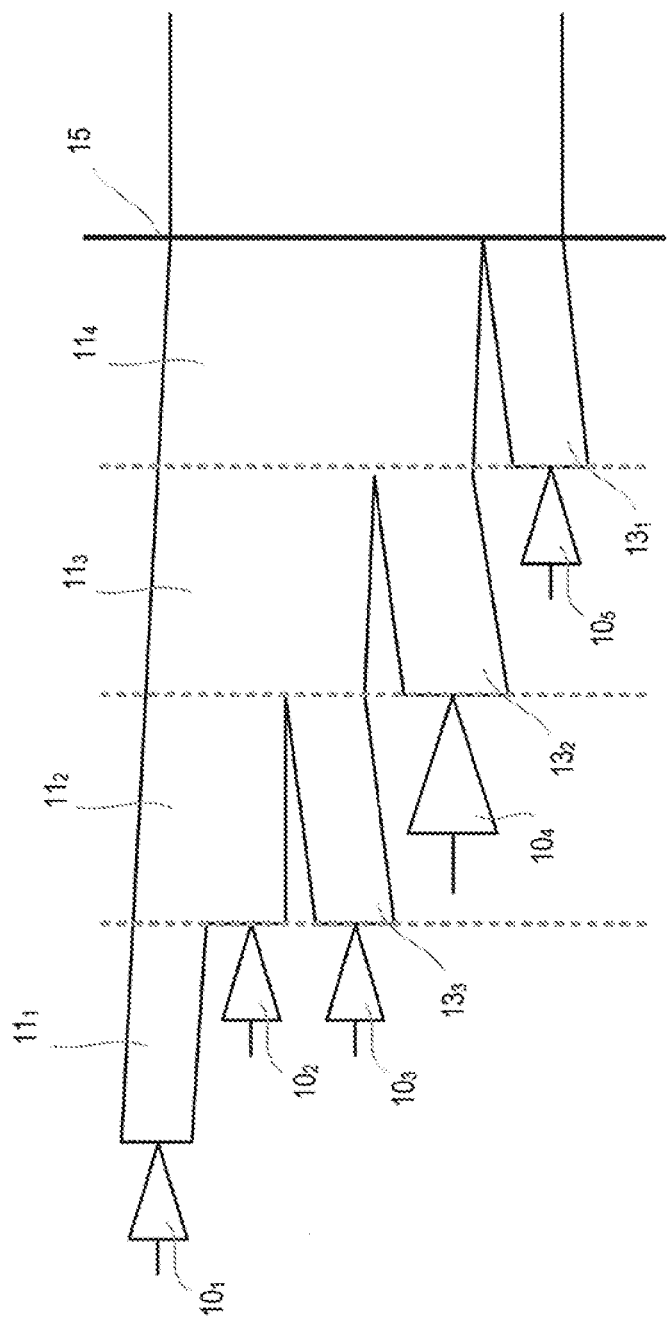

FIG. 23a shows such a configuration for a 5-stage amplifier, although it is noted that this aspect can be used with any number of stages of four and above.

As with the five stage example of FIG. 8a, FIG. 23a shows an amplifier arrangement comprising five amplifier stages, $10_1$ to $10_5$, and a cascade of quarter wavelength transmission lines $11_1$ to $11_4$ coupled between an output of an amplifier of a first amplifier stage $10_1$ and an output node 15 of the amplifier arrangement. The cascade comprises four quarter wavelength transmission lines $11_1$ to $11_4$ in this example, of decreasing characteristic impedance towards the output node.

An amplifier of the 5th stage $10_5$ is coupled to the output node, and remaining amplifiers between the $1^{st}$ and 4th stages (amplifiers $10_2$, $10_3$ and $10_4$ in this example) are coupled to successive junctions in the cascade of quarter wavelength transmission lines $11_1$ to $11_4$.

The amplifier arrangement is configured such that the amplifier of the 5th stage $10_5$ is coupled to the output node 15 via a connecting quarter wavelength transmission line $13_1$, with each of the remaining amplifiers closest to the output node 15 apart from the first and second amplifiers $10_1$, $10_2$, (being the amplifiers of stages $10_3$ and $10_4$ in this example), being coupled by a respective connecting quarter wavelength transmission line ($13_2$, $13_3$ in this example) to a junction of the cascade of quarter wavelength transmission lines.

According to the embodiment of FIG. 23a, each of the amplifiers in the N amplifier stages (i.e. $10_1$ to $10_5$) is of a substantially equal size apart from an amplifier in the N−1 amplifier stage $10_{N-1}$ (i.e. $10_4$) that is second closest to the output node, wherein the amplifier in this $4^{th}$ stage is increased in size relative to the amplifiers in the other stages $10_1$ to $10_{N-2}$, $10_N$ (i.e. amplifiers $10_1$ to $10_3$, $10_5$ in this example).

According to one embodiment, the amplifier in the N−1 stage $10_{N-1}$ (i.e. the amplifier of the $4^{th}$ stage $10_4$ in this example) is increased in size compared to the other amplifiers in the other amplifier stages, and wherein the characteristic impedance of the connecting quarter wavelength transmission line $13_2$ coupling the amplifier in the N−1 stage ($4^{th}$ stage in this example) to the cascade is decreased compared to the characteristic impedance of each of the other connecting quarter wavelength transmission lines $13_1$, $13_3$ to $13_{N-2}$ ($13_1$ and $13_3$ in this example).

For example, according to one embodiment the amplifier in the $4^{th}$ stage $10_4$ is increased by about 25-50% in size compared to the other amplifiers in the other amplifier stages ($10_1$ to $10_3$, $10_N$), and wherein the characteristic impedance of the connecting quarter wavelength transmission line ($13_2$) coupling the amplifier in the $4^{th}$ stage to the cascade is substantially decreased by about 20-50% compared to the characteristic impedance of each of the other connecting quarter wavelength transmission lines ($13_1$ and $13_3$).

For example, the amplifier in the $4^{th}$ stage can be about 30% larger than the other amplifiers, and the characteristic impedance of its connecting quarter wavelength transmission line correspondingly 23% lower than for the rest of the connecting quarter wavelength transmission lines.

As mentioned above, this has the benefit of providing a more even distribution of transition points.

Figure 23B:
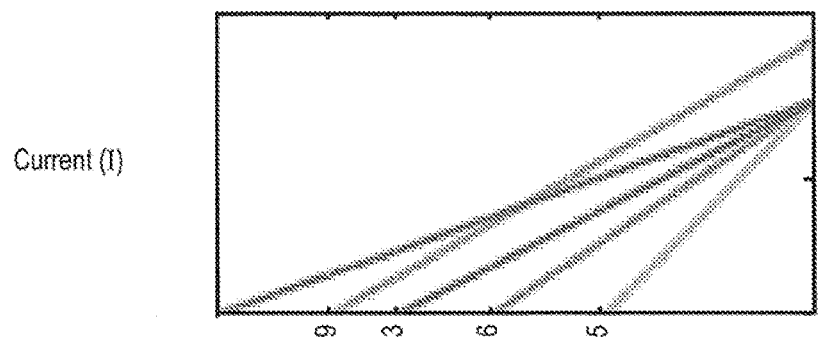

This has the advantage that the larger amplifier in the stage second closest to the output node allows the distribution of transition points to be improved further, as reflected in FIG. 23b, whereby the transition points occur at 0.19, 0.3, 0.46 and 0.65 of full output amplitude, thus being more evenly spread than other embodiments.

Figure 23C:
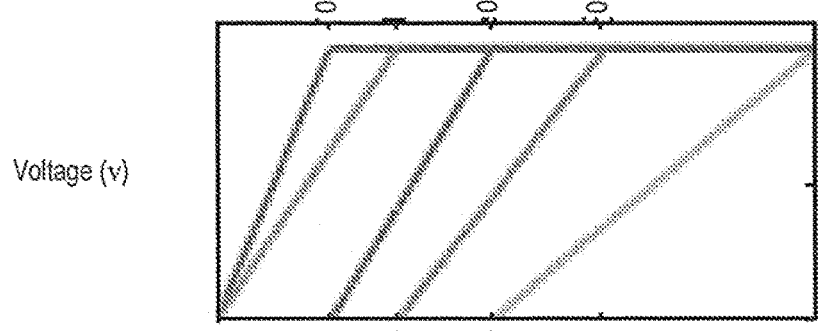

FIG. 23c shows the voltages of the respective amplifier stages $10_1$ to $10_5$ relative to full output amplitude.

Figure 23D:
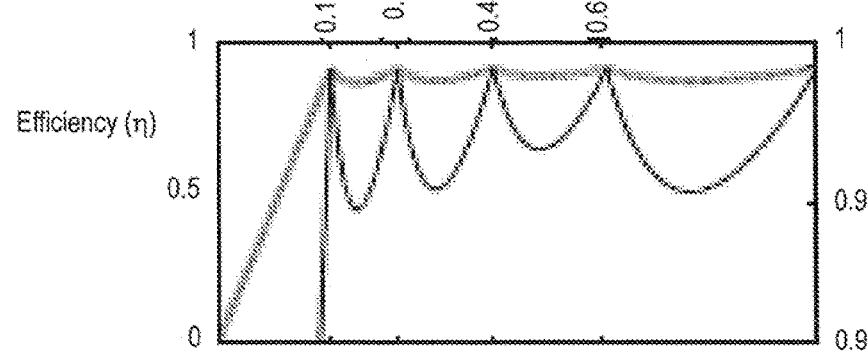

Referring to FIG. 23d, the efficiency curve for such an amplifier designed for five amplifier stages with the stage second closest to the output being larger in size has five peaks; at 0.19, 0.3, 0.46, 0.65 and 1 of full output amplitude. This distribution of transition points is advantageous for high-PAR signals, and better that the prior art solutions for all relevant Rayleigh PAR values. In particular, such an even distribution of transition points would generally require more different sizes of transistors if prior art Doherty amplifiers were used.

The same advantageous property is consistently achieved for higher numbers of stages, It is noted that the values of increase and decrease given in the embodiments herein are examples only, and that variations can be made without departing from the invention as defined in the appended claims.

It is noted that the embodiment of FIG. 23a may be used in combination with one or more of the other embodiments described herein. For example, increasing the impedance of the last quarterwave line, for example by 33%, and reducing the size of the amplifier, for example to 75%, and reducing the impedance of the second last line, for example by 13%, and increasing the size of the corresponding amplifier, for example by 15%.

Figure 24A:
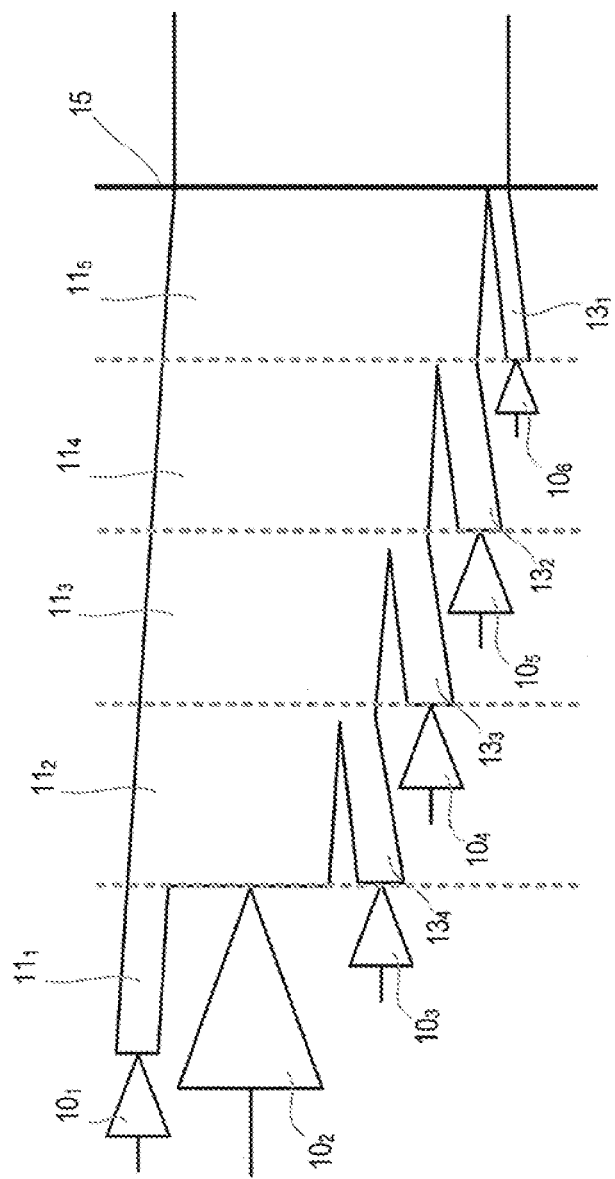

Referring to FIG. 24a, according to another aspect of the invention, the size of the last peaking amplifier (the amplifier of the second stage $10_2$) can be increased, such that the entire set of efficiency peaks can be translated to lower amplitudes, and with retained evenness. This is shown in FIG. 24a for a 6-stage amplifier, although it is noted that the same principle can be used for any number of stages from four and above.

As with the 6 stage example of FIG. 10a, FIG. 24a shows an amplifier arrangement comprising 6 amplifier stages, $10_1$ to $10_6$, and a cascade of quarter wavelength transmission lines $11_1$ to $11_5$ coupled between an output of an amplifier of a first amplifier stage $10_1$ and an output node 15 of the amplifier arrangement. The cascade comprises five quarter wavelength transmission lines $11_1$ to $11_5$ in this example, of decreasing characteristic impedance towards the output node.

An amplifier of the 6th stage $10_6$ is coupled to the output node, and remaining amplifiers between the $1^{st}$ and 6th stages (amplifiers $10_2$ to $10_5$ in this example) are coupled to successive junctions in the cascade of quarter wavelength transmission lines $11_1$ to $11_5$.

The amplifier arrangement is configured such that the amplifier of the 6th stage $10_6$ is coupled to the output node 15 via a connecting quarter wavelength transmission line $13_1$, with each of the remaining amplifiers closest to the output node 15 apart from the first and second amplifiers $10_1$, $10_2$ (being the amplifiers of stages $10_3$, $10_4$ and $10_5$ in this example), being coupled by a respective connecting quarter wavelength transmission line ($13_2$, $13_3$ and $13_4$ in this example) to a junction of the cascade of quarter wavelength transmission lines.

According to the embodiment of FIG. 24a the amplifier in the second stage $10_2$ is increased or decreased compared to the other amplifiers in at least the first to N−2 other amplifier stages $10_1$, $10_3$ to $10_{N-2}$, (i.e. compared to at least the amplifiers $10_1$ and $10_3$ to $10_4$ in this example), and the characteristic impedance decreased or increased in a corresponding manner.

By increasing the size of this amplifier in the second stage $10_2$, effectively the last peaking amplifier, this causes the entire set of efficiency peaks to be translated to lower amplitudes, with retained evenness. Likewise, decreasing the size of this amplifier causes the whole bunch of efficiency peaks to be translated to higher amplitudes, also with retained evenness Since the amplifier of the second stage is increased in the example of FIG. 24a, FIG. 24b shows how the transition points have been shifted to occur at 0.06, 0.12, 0.19, 0.27 and 0.35 of full output amplitude, while maintaining the more evenly spread compared to other embodiment.

Figures 24B, 24C, 24D:
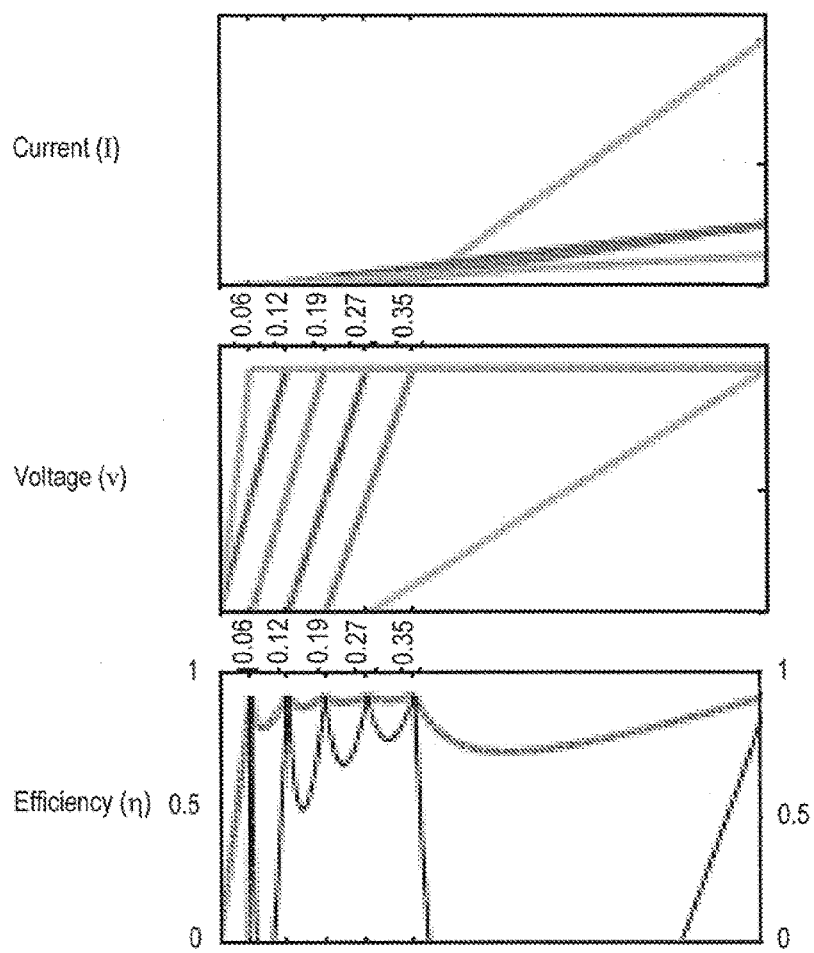

FIG. 24b shows the voltages of the respective amplifier stages $10_1$ to $10_6$ relative to full output amplitude.

Referring to FIG. 24d, the efficiency curve for such an amplifier designed for six amplifier stages with the stage second closest to the input being larger in size has six peaks; at 0.06, 0.12, 0.19, 0.27, 0.35 and 1 of full output amplitude. This distribution of transition points is advantageous for high-PAR signals, and better that the prior art solutions for all relevant Rayleigh PAR values.

In the example of FIG. 24a the amplifier of the second stage is four times as large as the four 'middle' amplifiers. This efficiency peak shift can be made larger or smaller without disturbing the evenness of the efficiency peaks. A shift in the other direction is achieved by making the transistor smaller instead. Also in this case the evenness of the efficiency peak distribution is retained.

It is noted that the embodiment of FIG. 24a may be used in combination with any one or more of the other embodiments described herein. For example, increasing the impedance of the last quarterwave line, for example by 33%, and reducing the size of the amplifier, for example to 75%, and reducing the impedance of the second last line, for example by 13%, and increasing the size of the corresponding amplifier, for example by 15%.

It is noted that in the embodiments described herein, any quarterwave line can double as an impedance transformer, i.e. the impedance and corresponding maximum RF voltage swings can be individually adjusted for each transistor. This can be useful if one or more of the transistors are made with a different technology having a different voltage rating. It can also be beneficial to use these transformations to accommodate a different load impedance, instead of making this transformation outside of the Doherty amplifier which would require extra impedance transformers. Apart from these considerations, it can be advantageous to have as little extra impedance transformations as possible in the Doherty network, since this generally gives high bandwidth and low sensitivity.

Transistors in general act as controlled RF current sources, so the shape of the amplitudes and phases (relative to that of the output) of the RF currents as functions of the output amplitude also suggest the shaping that must be performed to the input signals to the transistors, i.e. the gate drive voltages. The actual shapes may have to take into account that the voltage-to-current conversion (transconductance) in the transistors is more or less nonlinear, and that the RF voltage swing can influence the output current as well (especially via saturation when close to the upper limit). Causing a transistor to turn on at a higher amplitude is often done by lowering the gate bias to the transistor, i.e. operating in class C. This means that less large-scale amplitude shaping needs to be done earlier in the processing chain, but usually at the cost of lower gain and lower maximum output power.

It is also noted that any of the transmission lines in the examples described herein can be wholly or partially replaced by combinations of lumped elements. For example, the quarterwave lines can be replaced by LC pi- or T-networks with inductors (L) and capacitors (C) with reactances equal in magnitude to the characteristic impedance of the replaced quarterwave line.

The embodiments of the invention provide advantageous Doherty amplifiers with four or more stages. For high PAR signals, the distribution of transition points when equal size transistors are used is improved compared to prior art Doherty amplifiers.

According to some embodiments, by simply halving the size of one transistor, and doubling the characteristic impedance of the corresponding quarterwave line, the efficiency peaks can be distributed even more evenly, which increases average efficiency for high-PAR signals. According to other embodiments, by changing the size of another transistor (for example the second amplifier stage), the whole bunch of efficiency peaks can be moved to higher or lower amplitude ranges, with retained evenness. Good dimensioning is thus easily achieved.

Another advantageous property of the embodiments described herein is that the drive signal shaping is simple. In one embodiment, only different gains and different static gate biases are necessary.

Figure 25:
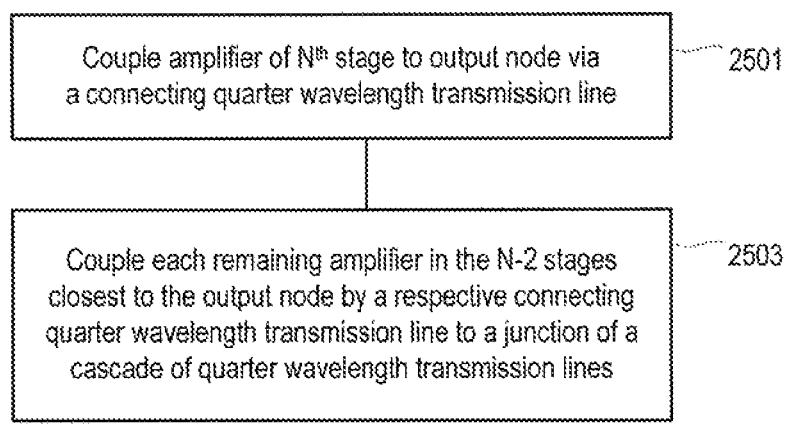
FIG. 25 shows a method according to another embodiment of the present invention.

FIG. 25 shows a method of improving the efficiency of an amplifier arrangement comprising N amplifier stages $10_1$ to $10_N$, wherein N is an integer equal or greater than four, wherein the amplifier arrangement comprises a cascade of quarter wavelength transmission lines coupled between an output of an amplifier of a first amplifier stage $10_1$ and an output node 15 of the amplifier arrangement, wherein the cascade comprises N−1 quarter wavelength transmission lines $11_1$ to $11_{N-1}$, and wherein an amplifier of the Nth stage $10_N$ is coupled to the output node 15, and remaining amplifiers between the first and Nth stages $10_2$ to $10_{N-1}$ coupled to successive junctions in the cascade of quarter wavelength transmission lines $11_1$ to $11_{N-1}$.

The method comprises the steps of coupling the amplifier of the Nth stage $10_N$ to the output node 15 via a connecting quarter wavelength transmission line $13_1$, step 2501.

Each of the remaining amplifiers $10_3$ to $10_{N-1}$ in the N−2 stages closest to the output node 15 is coupled by a respective connecting quarter wavelength transmission line $13_2$ to $13_{N-2}$ to a junction of the cascade of quarter wavelength transmission lines, step 2503.

Figure 26B:
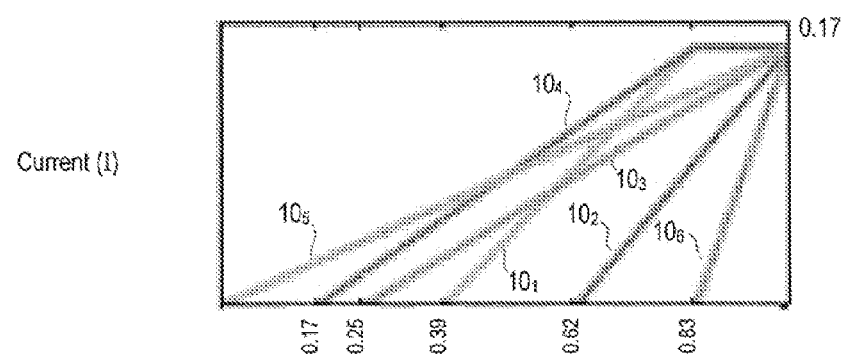
Figure 26C:
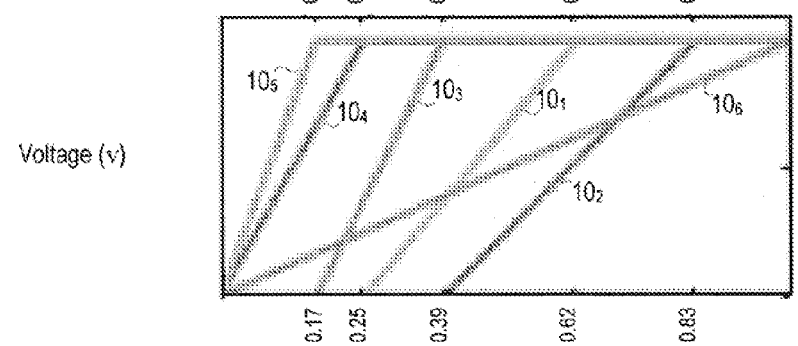
Figure 26D:
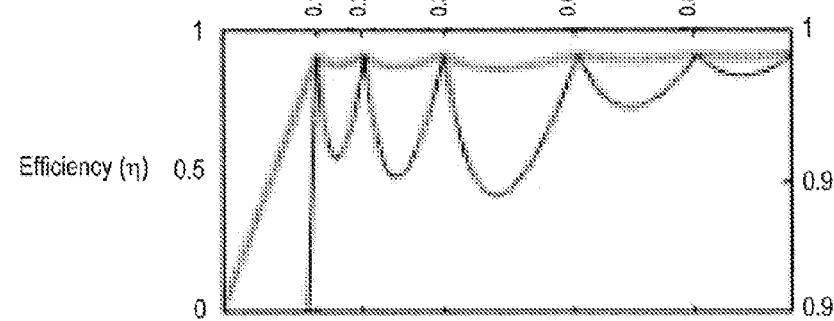

FIG. 26a shows an amplifier arrangement according to another aspect, with FIGS. 26b to 26d showing current, voltage and efficiency curves for the amplifier arrangement of FIG. 26a.

The arrangement of FIG. 26a is a six-stage amplifier arrangement similar to that of FIG. 10a. However, according to this particular aspect, the Nth amplifier $10_6$ is coupled directly to the output node 15, rather than via a connecting transmission line as provided in FIG. 10a. Also, in this arrangement the cascade of quarter wavelength transmission lines comprises N−2 stages, i.e. $11_1$ to $11_4$, rather than N−1 stages as provided in FIG. 10a. Thus, FIG. 26a shows an example of an amplifier arrangement comprising six amplifier stages $10_1$ to $10_6$, i.e. N=6.

The amplifier arrangement comprises a cascade of quarter wavelength transmission lines $11_1$ to $11_4$ coupled between an output of an amplifier of a first amplifier stage $10_1$ and an output node 15 of the amplifier arrangement. The cascade comprises four (N−2) quarter wavelength transmission lines $11_1$ to $11_4$ of decreasing characteristic impedance towards the output node.

An amplifier of the sixth stage $10_6$ is coupled to the output node 15, and remaining amplifiers between the first and sixth stages, i.e. the amplifiers of stages $10_2$ to $10_5$ in this example, coupled to successive junctions in the cascade of quarter wavelength transmission lines $11_1$ to $11_4$.

The amplifier arrangement is configured such that the amplifier $10_6$ of the sixth stage is coupled directly to the output node 15, with each of the remaining amplifiers of the four stages closest to the output node 15 (i.e. amplifiers $10_3$ to $10_5$ in this example) being coupled by a respective connecting quarter wavelength transmission line 13 to a junction of the cascade of quarter wavelength transmission lines.

FIG. 26b shows a plot of current against output amplitude for the six-stage arrangement as shown in FIG. 26a. The order of the amplifier starting points in this example is amplifier $10_5$ starting at zero, amplifier $10_4$ starting at 0.17 of full output amplitude, amplifier $10_3$ starting at 0.25 of full output amplitude, amplifier $10_1$ starting at 0.39 of full output amplitude, amplifier $10_2$ starting at 0.62 of full output amplitude, and amplifier $10_6$ starting at 0.83 of full output amplitude.

FIG. 26c shows the voltages of the respective amplifier stages $10_1$ to $10_6$ relative to full output amplitude.

Referring to FIG. 26d, this shows the efficiency curve, using six transistors of substantially equal size, having six peaks; at 0.17, 0.25, 0.39, 0.62, 0.83 and 1 of full output amplitude.

FIG. 27a shows an amplifier arrangement according to another aspect, with FIGS. 27b to 27d showing current, voltage and efficiency curves for the amplifier arrangement of FIG. 27a.

The arrangement of FIG. 27a is an example of a eight-stage amplifier arrangement. According to this particular aspect, the Nth amplifier $10_8$ is coupled directly to the output node 15, rather than via a connecting quarter wavelength transmission line. Also, in this arrangement the cascade of quarter wavelength transmission lines comprises N−2 stages, i.e. $11_1$ to $11_6$, rather than N−1 stages as provided in the earlier embodiments. Thus, FIG. 27a shows an example of an amplifier arrangement comprising eight amplifier stages $10_1$ to $10_8$, i.e. N=8.

The amplifier arrangement comprises a cascade of quarter wavelength transmission lines $11_1$ to $11_6$ coupled between an output of an amplifier of a first amplifier stage $10_1$ and an output node 15 of the amplifier arrangement. The cascade comprises six (N−2) quarter wavelength transmission lines $11_1$ to $11_6$ of decreasing characteristic impedance towards the output node.

An amplifier of the sixth stage $10_6$ is coupled to the output node 15, and remaining amplifiers between the first and sixth stages, i.e. the amplifiers of stages $10_2$ to $10_5$ in this example, coupled to successive junctions in the cascade of quarter wavelength transmission lines $11_1$ to $11_4$.

The amplifier arrangement is configured such that the amplifier $10_8$ of the eighth stage is coupled directly to the output node 15, with each of the remaining amplifiers of the six stages closest to the output node 15 (i.e. amplifiers $10_3$ to $10_7$ in this example) being coupled by a respective connecting quarter wavelength transmission line 13 to a junction of the cascade of quarter wavelength transmission lines.

FIG. 27b shows a plot of current against output amplitude for the eight-stage arrangement as shown in FIG. 27a. The order of the amplifier starting points in this example is amplifier $10_7$ starting at zero, amplifier $10_6$ starting at 0.12 of full output amplitude, amplifier $10_5$ starting at 0.17 of full output amplitude, amplifier $10_4$ starting at 0.27 of full output amplitude, amplifier $10_3$ starting at 0.37 of full output amplitude amplifier, $10_1$ starting at 0.47 of full output amplitude, amplifier 10₂ starting at 0.69 of full output, and amplifier 10₈ starting at 0.87 of full output amplitude.

FIG. 27c shows the voltages of the respective amplifier stages 10₁ to 10₈ relative to full output amplitude.

Referring to FIG. 26d, this shows the efficiency curve, using eight transistors of substantially equal size, having six peaks; at 0.12, 0.17, 0.27, 0.37, 0.47, 0.69, 0.87 and 1 of full output amplitude.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier arrangement comprising N amplifier stages, wherein N is an integer equal or greater than four; the amplifier arrangement comprising:
   a cascade of quarter wavelength transmission lines coupled between an output of an amplifier of a first amplifier stage and an output node of the amplifier arrangement, wherein the cascade comprises N−1 quarter wavelength transmission lines for each N amplifier stages;
   wherein an amplifier of the Nth stage is directly coupled to the output node, and remaining amplifiers between the first and the Nth stages directly coupled to successive junctions in the cascade of quarter wavelength transmission lines; and
   wherein the amplifier arrangement is further configured such that:
   the direct coupling of the amplifier of the Nth stage to the output node is via a connecting quarter wavelength transmission line; and
   each direct coupling of the remaining amplifiers of the N−3 stages closest to the output node is via a respective connecting quarter wavelength transmission line to a respective junction of the cascade of quarter wavelength transmission lines.

2. The amplifier as claimed in claim 1, wherein each of the amplifiers in the N amplifier stages is of a substantially equal size.

3. The amplifier as claimed in claim 1, wherein a characteristic impedance of each successive stage in the cascade of quarter wavelength transmission lines is reduced towards the output node in relation to the parallel combination of preceding connecting transmission lines, whereby the characteristic impedance of each successive stage is reduced to 1/M of the impedance of the transmission line from a single amplifier, whereby M relates to the number of preceding amplifiers.

4. The amplifier as claimed in claim 1, wherein the characteristic impedance of each of the connecting quarter wavelength transmission lines is substantially equal.

5. The amplifier as claimed in claim 1, wherein each of the amplifiers in the first to N−1 amplifier stages is of a substantially equal size, and wherein the amplifier in the Nth amplifier stage which is closest to the output node is different in size to the other amplifiers.

6. The amplifier as claimed in claim 5, wherein the amplifier in the Nth amplifier stage is reduced in size compared to the other amplifiers in the other amplifier stages, and wherein the characteristic impedance of the connecting quarter wavelength transmission line coupling the amplifier in the Nth amplifier stage to the output node is increased by a corresponding ratio compared to the characteristic impedance of each of the other connecting quarter wavelength transmission lines.

7. The amplifier as claimed in claim 6, wherein the amplifier in the Nth amplifier stage is substantially halved in size compared to the other amplifiers in the other amplifier stages, and wherein the characteristic impedance of the connecting quarter wavelength transmission line coupling the amplifier in the Nth stage to the output node is substantially doubled in size compared to the characteristic impedance of each of the other connecting quarter wavelength transmission lines.

8. The amplifier as claimed in claim 1, wherein each of the amplifiers in the N amplifier stages is of a substantially equal size apart from an amplifier in the N−1 amplifier stage that is second closest to the output node, wherein the amplifier in the N−1 stage is increased in size relative to the amplifiers in the other stages.

9. The amplifier as claimed in claim 8, wherein the amplifier in the N−1 stage is increased in size compared to the other amplifiers in the other amplifier stages, and wherein the characteristic impedance of the connecting quarter wavelength transmission line coupling the amplifier in the N−1 stage to the cascade is decreased compared to the characteristic impedance of each of the other connecting quarter wavelength transmission lines.

10. The amplifier as claimed in claim 9, wherein the amplifier in the N−1 stage is increased by about 25-50% in size compared to the other amplifiers in the other amplifier stages, and wherein the characteristic impedance of the connecting quarter wavelength transmission line coupling the amplifier in the N−1 stage to the cascade is substantially decreased by about 20-50% compared to the characteristic impedance of each of the other connecting quarter wavelength transmission lines.

11. The amplifier as claimed in claim 1, wherein the amplifier in the second stage is increased or decreased compared to the other amplifiers in at least the first to N−2 other amplifier stages, and the characteristic impedance decreased or increased in a corresponding manner.

12. A method of improving the efficiency of an amplifier arrangement comprising N amplifier stages, wherein N is an integer equal or greater than four; wherein the amplifier arrangement comprises a cascade of quarter wavelength transmission lines coupled between an output of an amplifier of a first amplifier stage and an output node of the amplifier arrangement, wherein the cascade comprises N−1 quarter wavelength transmission lines for each N amplifier stages, and wherein an amplifier of the Nth stage is directly coupled to the output node, and remaining amplifiers between the first and Nth stages directly coupled to successive junctions in the cascade of quarter wavelength transmission lines; the method comprising the steps of:
   directly coupling the amplifier of the Nth stage to the output node via a connecting quarter wavelength transmission line; and
   directly coupling each of the remaining amplifiers in the N−3 stages closest to the output node via a respective connecting quarter wavelength transmission line to a respective junction of the cascade of quarter wavelength transmission lines.

13. The method as claimed in claim 12, wherein each of the amplifiers in the N amplifier stages is of a substantially equal size.

14. The method as claimed in claim 12, further comprising the step of reducing a characteristic impedance of each successive stage in the cascade of quarter wavelength transmission lines towards the output node in relation to the parallel combination of preceding connecting transmission lines, whereby the characteristic impedance of each successive stage is reduced to 1/M of the impedance of the transmission line from a single amplifier, whereby M relates to the number of preceding amplifiers.

15. The method as claimed in claim 12, wherein the characteristic impedance of each of the connecting quarter wavelength transmission lines is substantially equal.

16. The amplifier as claimed in claim 1, wherein an amplifier of the second stage is directly connected to its corresponding junction without a respective connecting quarter wavelength transmission line.

17. The method as claimed in claim 12, wherein an amplifier of the second stage is directly connected to its corresponding junction without a respective connecting quarter wavelength transmission line.

* * * * *